(12) United States Patent
Choi et al.

(10) Patent No.: US 12,280,325 B2
(45) Date of Patent: Apr. 22, 2025

(54) POROUS COMPOSITE STRUCTURE, METHOD OF PREPARING THE SAME, ARTICLE INCLUDING THE SAME, AND AIR PURIFIER INCLUDING THE SAME

(71) Applicants: Samsung Electronics Co., Ltd., Suwon-si (KR); POSTECH Research and Business Development Foundation, Pohang-si (KR)

(72) Inventors: Hyoungwoo Choi, Hwaseong-si (KR); Hyomin Lee, Pohang-si (KR); Min Ryu, Pohang-si (KR); Jinkyu Kang, Hwaseong-si (KR); Joonseon Jeong, Seoul (KR); Dongwook Kim, Suwon-si (KR); Daehoon Park, Paju-si (KR); Hyun Chul Lee, Hwaseong-si (KR)

(73) Assignees: SAMSUNG ELECTRONICS CO., LTD., Gyeonggi-Do (KR); POSTECH RESEARCH AND BUSINESS DEVELOPMENT FOUNDATION, Gyeongsangbuk-do (KR)

( * ) Notice: Subject to any disclaimer, the term of this patent is extended or adjusted under 35 U.S.C. 154(b) by 423 days.

(21) Appl. No.: 17/750,884

(22) Filed: May 23, 2022

(65) Prior Publication Data
US 2022/0370937 A1   Nov. 24, 2022

(30) Foreign Application Priority Data

May 24, 2021 (KR) .................. 10-2021-0066493
Feb. 28, 2022 (KR) .................. 10-2022-0026218

(51) Int. Cl.
  *B01D 47/06* (2006.01)
  *B01D 39/20* (2006.01)
  (Continued)

(52) U.S. Cl.
  CPC ..... *B01D 39/2072* (2013.01); *B01D 46/0001* (2013.01); *B01D 46/02* (2013.01);
  (Continued)

(58) Field of Classification Search
  CPC ........... B01D 47/00; B01D 47/06; B05D 5/08
  See application file for complete search history.

(56) References Cited

U.S. PATENT DOCUMENTS 8,702,850 B2   4/2014   Suzuki et al.
9,683,197 B2   6/2017   Aizenberg et al.
(Continued)

FOREIGN PATENT DOCUMENTS

CN   110198996 A   9/2019
KR   100715778 B1   5/2007
(Continued)

OTHER PUBLICATIONS

Alexander K. Epsteina et al., "Liquid-infused structured surfaces with exceptional anti-biofouling performance," PNAS, Aug. 14, 2012, pp. 13182-13187, vol. 109, No. 33.
(Continued)

*Primary Examiner* — Robert A Hopkins
(74) *Attorney, Agent, or Firm* — CANTOR COLBURN LLP

(57) ABSTRACT

A porous composite structure including a substrate including a plurality of nanostructures; a particle layer disposed on a surface of the substrate; and a liquid, a method of preparing the porous composite structure, an article including the porous composite structure, and an air purifier including the porous composite structure.

30 Claims, 14 Drawing Sheets

(51) Int. Cl.
  *B01D 46/00* (2022.01)
  *B01D 46/02* (2006.01)
  *B05D 5/08* (2006.01)
  *B82B 3/00* (2006.01)
  *B82Y 30/00* (2011.01)
  *B82Y 40/00* (2011.01)

(52) U.S. Cl.
  CPC .............. *B01D 47/06* (2013.01); *B05D 5/08* (2013.01); *B82B 3/0019* (2013.01); *B82B 3/0047* (2013.01); *B82Y 30/00* (2013.01); *B82Y 40/00* (2013.01); *B01D 2201/184* (2013.01)

(56) References Cited

U.S. PATENT DOCUMENTS

| | | | |
|---|---|---|---|
| 9,932,482 | B2 | 4/2018 | Aizenberg et al. |
| 10,434,542 | B2 * | 10/2019 | Dai ................. B08B 17/065 |
| 10,557,042 | B2 | 2/2020 | Lynn et al. |
| 10,557,044 | B2 | 2/2020 | Lynn et al. |
| 10,982,100 | B2 | 4/2021 | Aizenberg et al. |
| 11,448,409 | B2 | 9/2022 | Park et al. |
| 2017/0028095 | A1 | 2/2017 | Ohyama et al. |
| 2017/0056834 | A1 * | 3/2017 | Bhushan ................. C08K 3/36 |
| 2021/0231324 | A1 | 7/2021 | Park et al. |
| 2021/0322917 | A1 | 10/2021 | Jeong et al. |
| 2022/0126234 | A1 | 4/2022 | Jeong et al. |
| 2023/0151983 | A1 | 5/2023 | Jeong et al. |

FOREIGN PATENT DOCUMENTS

| | | | |
|---|---|---|---|
| KR | 20190102394 A | * | 9/2019 |
| KR | 1020200068475 A | | 6/2020 |
| KR | 20210097030 A | | 8/2021 |
| KR | 1020210097030 A | | 8/2021 |
| KR | 20210128270 A | | 10/2021 |
| KR | 20220056021 A | | 5/2022 |

OTHER PUBLICATIONS

Daniel C Leslie et al., "A bioinspired omniphobic surface coating on medical devices prevents thrombosis and biofouling," nature biotechnology, Oct. 12, 2014, pp. 1-10.

Linlin Xiao et al., "Slippery Liquid-Infused Porous Surfaces Showing Marine Antibiofouling Properties, " ACS Applied Materials & Interfaces, Sep. 25, 2013, pp. 10074-10080, vol. 5.

Peter W. Wilson et al., "Inhibition of ice nucleation by slippery liquid-infused porous surfaces (SLIPS)," Phys. Chem. Chem. Phys.,, Nov. 14, 2012, pp. 581--585, vol. 15.

Philseok Kim et al., "Liquid-Infused Nanostructured Surfaces with Extreme Anti-Ice and Anti-Frost Performance," ACS Nano, Jun. 10, 2012, pp. 6569-6577, vol. 6, No. 8.

Tak-Sing Wong et al., "Bioinspired self-repairing slippery surfaces with pressure-stable omniphobicity," Nature, Sep. 22, 2011, pp. 443-447, vol. 477.

Uttam Manna et al., "Slippery Liquid-Infused Porous Surfaces that Prevent Microbial Surface Fouling and Kill Non-Adherent Pathogens in Surrounding Media: A Controlled Release Approach," Adv. Funct. Mater., Apr. 27, 2016, pp. 3599-3611, vol. 26.

Tak-Sing Wong et al., "Bioinspired self-repairing slippery surfaces with pressure-stable omniphobicity", Sep. 22, 2011, Nature, 477(7365), pp. 443-447.

* cited by examiner

POROUS COMPOSITE STRUCTURE, METHOD OF PREPARING THE SAME, ARTICLE INCLUDING THE SAME, AND AIR PURIFIER INCLUDING THE SAME

CROSS-REFERENCE TO RELATED APPLICATION

This application is based on and claims priority under 35 U.S.C. § 119 to Korean Patent Application No. 10-2021-0066493, filed on May 24, 2021, and 10-2022-0026218, filed on Feb. 28, 2022, in the Korean Intellectual Property Office, the disclosures of which are incorporated by reference herein in their entirety.

BACKGROUND

1. Field

The present disclosure relates to porous composite structures, methods of preparing the porous composite structures, articles including the porous composite structures, and air purifiers including the porous composite structures.

2. Description of the Related Art

A slippery liquid infused porous surface (SLIPS) is inspired by a wax-type material coated on a nanostructure of a leaf of Nepenthes pitcher plant and is a technique for stably trapping a liquid thin film by preparing nanostructures on a solid surface and modifying the surface.

SUMMARY

Provided are porous composite structures having improved mechanical properties and durability.

Provided are methods of preparing the porous composite structures.

Provided are articles including the porous composite structures.

Provided are air purifiers including the porous composite structures.

Additional aspects will be set forth in part in the description which follows and, in part, will be apparent from the description, or may be learned by practice of an embodiment of the disclosure.

According to an aspect of an embodiment, a porous composite structure includes:
a substrate including a plurality of nanostructures;
a particle layer disposed on a surface of the substrate; and
a liquid.

The porous composite structure further may include an interlayer, wherein the interlayer may be disposed on the surface of the substrate, and the particle layer may be disposed on a surface of the interlayer.

The substrate and the particle layer may form a re-entrant structure. The substrate may be in a form of a porous surface; and the liquid may be infused in the porous surface.

The porous composite structure may further include a material having an affinity for the liquid. Also, the material having an affinity for the liquid may be chemically bonded to the particle layer.

The plurality of nanostructures may include nanorods, nanoribbons, nanotubes, nanoblades, nanoplates, or a combination thereof; or the substrate may include a template including a plurality of nanoscale sized pores. The substrate may further include a base layer, and the nanostructures may include pillars protruding from the base layer, wherein the base layer and the pillars may be formed of a same material, and the pillars may include nanorods, nanoribbons, nanotubes, nanoblades, nanoplates, or a combination thereof.

The particle layer may include inorganic particles, organic particles, or a combination thereof.

In an embodiment, the particle layer may be an inorganic particle layer including $SiO_2$, $Al_2O_3$, $TiO_2$, $ZnO_2$, $WO_3$, $SnO_2$, $ZrO$, indium tin oxide (ITO), $CaCO_3$, or a combination thereof.

The interlayer the interlayer and the particle layer may be bound by electrostatic attraction.

In an embodiment, the particle layer may include a positively charged silica layer and a negatively charged silica layer charged.

The material having an affinity for liquid may be a fluorinated silane, wherein the fluorinated silane may be trichloro(1H,1H,2H,2H-perfluorooctyl)silane, 1H,1H,2H,2H-perfluorodecyltriethoxysilane, or a combination thereof.

The substrate may include a metal, a metal oxide, a metal hydroxide, a polymer, a glass, a ceramic, or a combination thereof.

A contact angle between water and an organic solvent of the porous composite structure may be about 170° or greater, and a sliding angle thereof is about 10° or less.

The interlayer may include a hydrolyzed, dehydrated and condensed product of a compound represented by Formula 1:

$$H_2N-R_1-Si(OR_2)_3 \qquad \text{Formula 1}$$

wherein, in Formula 1, $R_1$ is a C1-C20 alkylene group or a C6-C20 arylene group, and $R_2$ is hydrogen, a C1-C20 alkyl group, a C6-C20 aryl group, or Cl.

The compound represented by Formula 1 may be (3-aminopropyl)trimethoxysilane, (3-aminopropyl)triethoxysilane, (2-aminoundecyl)trimethoxysilane, aminophenyltrimethoxysilane, bis(trimethoxysilylpropyl)amine, N-(2-aminoethyl)-3-aminopropyltrimethoxysilane, or a combination thereof.

According to an aspect of an embodiment, a method of preparing a porous composite structure includes:
forming a particle layer on a substrate to prepare a first structure; and
providing a liquid on the first structure to prepare the porous composite structure, wherein the substrate comprises a plurality of nanostructures.

The method may further include forming an interlayer on the substrate before the forming of the particle layer on the substrate. The forming of the interlayer may include coating a compound represented by Formula 1 on the substrate:

$$H_2N-R_1-Si(OR_2)_3 \qquad \text{Formula 1}$$

wherein, in Formula 1, $R_1$ is a C1-C20 alkylene group or a C6-C20 arylene group, and $R_2$ is hydrogen, a C1-C20 alkyl group, a C6-C20 aryl group, or Cl.

The forming of the particle layer on the interlayer to prepare the first structure may include repeatedly contacting negatively charged inorganic particles and positively charged inorganic particles on the interlayer.

The particle layer may be a silica layer, wherein the silica layer may include a plurality of layers including a positively charged silica layer and a negatively charged silica layer charged.

The inorganic particles having a negative charge may be colloidal silica having a negative charge, and the positively charged inorganic particles may be positively charged colloidal silica.

The method may further include providing a material having an affinity for the liquid on the first structure before providing the liquid on the first structure.

The providing of the material having the affinity for the liquid may include coating the substrate with a fluorinated silane.

The method may further include performing an oxygen plasma treatment.

The method may further include preparing the substrate by removing impurities and a native oxide layer of the substrate, and etching to form the nanostructures.

According to an aspect of an embodiment, an article includes the porous composite structure.

According to an aspect of an embodiment, an air purifier includes the porous composite structure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
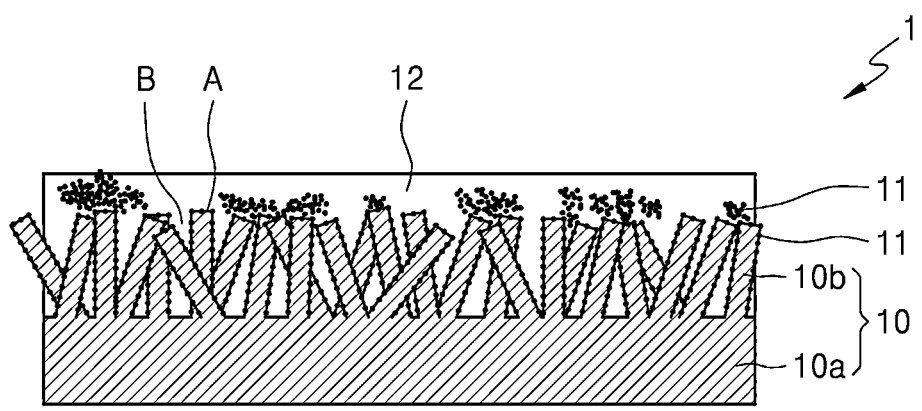
FIG. 1A is a schematic view of a structure of a porous composite structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, a "nanostructure" is a structure that has at least one dimension on the nanoscale. For example, the nanostructure may be a nanotextured surface that has one dimension on the nanoscale, e.g., only the thickness of a template including pores is between 0.1 and 100 nanometers (nm). In an embodiment, the nanostructure may have at least two dimensions on the nanoscale. For example, the nanostructure may be a nanotube having at least two dimensions on the nanoscale, e.g., the diameter of the nanotube nanostructure is between 0.1 and 100 nm; the length can be between 0.1 and 100 nm or greater.

As used herein, the term "liquid" may refer to a "slippery liquid".

As used herein, the term "slippery liquid" denotes lubricants that can be used, which more generically describes "silicon oil, fluorinated oil, paraffin-based oil, petroleum-based oil, olive oil, or a combination thereof."

A structure having a SLIPS may be prepared using methods such as multi-step lithography or three-dimensional (3D) printing. However, SLIPS structures may have poor mechanical properties and may collapse or the surface thereof may be reduced, for example, when contacted with an acid solution. Thus, the durability of SLIPS structures may not be sufficient, and manufacturing cost may be high.

Hereinafter, a porous composite structure according to an embodiment, a method of preparing the porous composite structure, an article including the porous composite structure, and an air purifier including the porous composite structure will be described in detail.

When a water vapor/oil vapor is separated using a separator capturing method, adsorption and condensation of the captured material may occur on a surface of a substrate, which may increase a driving differential pressure and contaminate the separator. In order to resolve this issue, a slippery liquid infused porous surface (SLIPS) structure may be used. When the SLIPS structure is used, the material condensed by the external flow may be easily separated from the substrate. In materials for a SLIPS, securing durability with respect to infusion or elution of slippery liquid is desirable for stability and long-term persistence of the system.

However, SLIPS structures may lack desirable mechanical properties and thus may not have sufficient durability as SLIPS structures may collapse or the surface thereof may be easily reduced, for example, when contacted with an acid solution, and thus improvement of a SLIPS structure is desired.

A porous composite structure according to an embodiment is designed to resolve the issue described above, and the porous composite structure includes a substrate having, e.g., including, nanostructures; a particle layer on a, e.g., at least one, surface of the substrate; and a slippery liquid.

The porous composite structure may further include a self-assembly layer on a, e.g., at least one, surface of the substrate. The particle layer may be on a, e.g., at least one, surface of the self-assembly layer.

The porous composite structure may further include an interlayer. The interlayer may be on a, e.g., at least one, surface of the substrate, and the particle layer may be on a, e.g., at least one, surface of the interlayer. The interlayer may be a self-assembly layer or an adhesive layer. The interlayer may be, for example, a polymer layer.

The porous composite structure may further include a material having an affinity for slippery liquid.

The material having an affinity for slippery liquid may have similar properties to the slippery liquid.

The substrate having nanostructures may have a composite structure. Also, the substrate may include a metal, a metal oxide, a metal hydroxide, a polymer, a glass, a ceramic, or a combination thereof.

In the porous composite structure according to an embodiment, the substrate and the particle layer may form a re-entrant structure.

In a porous composite structure according to an embodiment, a substrate, an interlayer, and a particle layer may form a re-entrant structure. When a porous composite structure has a re-entrant structure, once a slippery liquid, a material having an affinity for slippery liquid, or a combination thereof is between nanostructures of, e.g., on, the substrate, it may be relatively difficult for the slippery liquid, the material having an affinity for slippery liquid, or the combination thereof to be discharged to the outside, and thus excellent liquid-repellency of the porous composite structure may be maintained, and durability of the porous composite structure may be efficiently improved. Also, when a foreign material is introduced to the porous composite structure, entry of the foreign material into the structure may become difficult, which may increase decontamination efficiency of the porous composite structure. Entry between the nanostructures of, e.g., on, the substrate may be controlled to be relatively difficult, excellent liquid-repellency may be maintained, and durability of the porous composite structure may be efficiently improved. "Between" nanostructures of, e.g., on, the substrate refers to spaces between a plurality of nanostructures, for example, nanorods or nanoblades. The substrate having nanostructures may include a plurality of pores between the nanostructures and between the nanostructures and the substrate. The substrate having nanostructures may be in a form of a template including nanoscale sized pores. Also, as used herein, the liquid-repellency denotes a property of repelling water or oil. The excellent liquid-repellency may be confirmed by a contact angle or a sliding angle of a porous composite structure.

The nanostructures may be nanoribbons, nanoribbons, nanotubes, nanoblades, nanoplates, or a combination thereof. The substrate having nanostructures may include, e.g., be in a form of, a template including regular pores or random pores. The template having regular pores or random pores refers to a 3-dimensional (3D) structure having regular or random pores inside.

The substrate having nanostructures, according to an embodiment, includes a base layer and a plurality of pillars protruding from the base layer. The base layer and the pillars may be formed of the same material. The base layer is in a plate form, and the pillar portions may be nanorods, nanoribbons, nanotubes, nanoblades, nanoplates, or a combination thereof.

The base layer may be in the form of a mesh or foam.

The substrate having nanostructures may include, for example, concave portions and convex portions.

The porous composite structure according to an embodiment is a SLIPS structure, which undergoes a process of modifying surface characteristics on the substrate having a porous nanostructure using a material having an affinity for slippery liquid to provide an affinity for slippery liquid, and super water-repellent characteristics may be provided to the SLIPS structure using, for example, a fluorinated silane. Subsequently, the SLIPS structure may be prepared by undergoing providing slippery liquid.

The material having an affinity for slippery liquid may have a structure that is, e.g., may be, chemically bonded to a particle layer. The particle layer may be, for example, a silica ($SiO_2$) layer, and the material having an affinity for slippery liquid may be, for example, a fluorinated silane.

When a fluorinated silane is used as a material having an affinity for slippery liquid, the fluorinated silane may have a structure that is, e.g., may be, chemically bonded to a silica layer. A reaction between a hydroxy group of the silica layer and a functional group of the fluorinated silane react may proceed hydrolysis, dehydration, and condensation of the fluorinated silane, and thus a hydrolyzed, dehydrated and condensed product of the fluorinated silane is chemically bonded to the silica layer.

The particle layer may include inorganic particles, organic particles, or a combination thereof.

The particle layer may be, for example, an inorganic particle layer.

In an embodiment, the inorganic particle layer may include an, e.g., at least one, inorganic particle of $SiO_2$, $Al_2O_3$, $TiO_2$, $ZnO_2$, $WO_3$, $SnO_2$, $ZrO$, ITO, $CaCO_3$, or a combination thereof. The inorganic particles may have a size in a range of, for example, about 1 nanometer (nm) to about 80 nm, about 3 nm to about 65 nm, or about 5 nm to about 25 nm. When the diameter of the inorganic particles is within these ranges, durability of the porous composite structure may be improved.

As used herein, the term "size" may refer to a particle diameter when the particles are spherical, or may refer to a length of the major axis when the particles are non-spherical. The particle diameter may be, for example, an average particle diameter, and the length of the major axis may be, for example, an average length of the major axis. The average particle diameter and the average length of the major axis represent an average of the measured particle diameters and an average of the measured lengths of the major axis of the particles, each respectively.

As used herein, a size of particles may be evaluated using a particle size analyzer, a scanning electron microscope (SEM), or a transmission electron microscope (TEM). The particle size analyzer may be, for example, a LA-950 laser particle size analyzer available from Horiba International Co.

The average particle diameter may be, for example, an average particle diameter observed through an SEM, which may be calculated by taking an average value of particle diameters of about 10 to 30 particles using an SEM image.

When the particle size is measured using a particle size analyzer, the average particle size may refer to D50. D50 refers to a particle diameter corresponding to 50 volume % of a cumulative volume of particles in a particle distribution, and is a particle diameter value corresponding to 50% in an accumulated particle size distribution curve, when the total number of particles is 100% in the accumulated particle size distribution curve in which particles are sequentially accumulated in the order of a particle having the smallest size to a particle having the largest size.

D50 may be measured using a particle size analyzer. In an embodiment, a dynamic light-scattering measurement device may be used to perform a data analysis, and the number of particles may be counted for each particle size range. From this, the D50 value may be easily obtained through a calculation.

In an embodiment, the composite structure may have a porosity of about 30 volume percent (vol %) or greater, for example, about 30 vol % to 99.9 vol %. The particles of the composite structure having a porosity of about 30 vol % or greater, for example, about 30 vol % to 99.9 vol %, may be spherical, e.g., the composite structure may be coated with a spherical structure.

The inorganic particle layer may be formed in a continuous or discontinuous layer.

The negatively charged inorganic particles may be negatively charged colloidal silica, and the positively charged inorganic particles may be positively charged colloidal silica.

In the porous composite structure according to an embodiment, the interlayer (e.g., a self-assembly layer) and the inorganic particle layer may be bound by electrostatic attraction. When the layers are bound by electrostatic attraction, mechanical properties and durability of the porous composite structure may further be improved.

The interlayer may be changed according to a composition of the inorganic particle layer. The interlayer according to an embodiment may include a hydrolyzed, dehydrated and condensed product of a compound represented by Formula 1.

$$H_2N-R_1-Si(OR_2)_3 \quad \text{Formula 1}$$

wherein, in Formula 1, $R_1$ may be a C1-C20 alkylene group or a C6-C20 arylene group, and $R_2$ may be hydrogen, a C1-C20 alkyl group, a C6-C20 aryl group, or Cl.

The interlayer may be a self-assembly layer or an adhesive layer.

The interlayer may include, for example, a polymer. The interlayer including a polymer may serve as a self-assembly layer or an adhesive layer.

The inorganic particle layer may be a silica layer, wherein the silica layer has a multi-layer structure, wherein the plurality of silica layers may include a positively charged silica layer and a negatively charged silica layer.

The material having an affinity for slippery liquid may be a fluorinated silane, wherein the fluorinated silane may be trichloro(1H,1H,2H,2H-perfluorooctyl)silane, 1H,1H,2H, 2H-perfluorodecyltriethoxysilane, or a combination thereof.

A contact angle of the porous composite structure according to an embodiment with respect to water and an organic solvent may be about 170° or greater or, for example, in a range of about 170° to about 180°, and a sliding angle thereof may be about 10° or less or, for example, in a range of about 1° to about 10°. The organic solvent may be, for example, glycerol, diiodomethane, or a combination thereof.

Hereinafter, the porous composite structure according to an embodiment will be described with reference to the attached drawings. In the porous composite structure of the attached drawings, a particle layer may be, for example, an inorganic layer, and an interlayer may be, for example, a self-assembly layer.

FIG. 1A is a schematic view of a structure of a porous composite structure 1 according to an embodiment. Referring to FIG. 1A, the porous composite structure 1 includes a substrate 10 having nanostructures; an interlayer (not shown) on a part of the substrate 10; and an inorganic particle layer 11 on the interlayer. The interlayer is omitted and not shown in the drawing for convenience. The interlayer may be, for example, a self-assembly layer. An interlayer in a porous composite structure according to an embodiment may be omitted.

The inorganic particle layer 11 may be, for example, a silica layer.

As shown in FIG. 1A, the substrate 10 may include a base layer 10a and a pillar portion 10b including a plurality of nanorod shapes. The inorganic particle layer 11 may be located on a, e.g., at least one, surface (a top region A and a side region B) of the pillar portion 10b having nanorod shapes. As shown in FIG. 1A, the inorganic particle layer 11 may be mainly located at the top region A of the pillar portion 10b having nanorod shapes and may exist in a very small amount at the side regions B of the pillar portion 10b, as compared to the amount at the top region A. When the inorganic particle layer has the structure described above, the substrate, self-assembly layer, and inorganic particle layer of the porous composite structure may form a re-entrant structure as shown in FIG. 1A.

When the inorganic particle layer 11 is positioned as described above, the liquid having an affinity for slippery liquid and slippery liquid may be disposed in the same concentration gradient with that of the inorganic particle layer. The re-entrant structure may have a mushroom column structure or an umbrella shape, and the inorganic particle layer such as a silica layer may exist in a larger amount in a top region of substrates than in regions between a plurality of substrates. When the porous composite structure has the re-entrant structure as described above, slippery liquid 12 is infused in the re-entrant structure and not easily discharged by external stimulus, and the porous composite structure may have improved capability of impregnating slippery liquid and improved durability as compared to those of a structure not including the re-entrant structure. Also, overall characteristics including self-healing, ice-repellency or anti-frost, and anti-fouling characteristics as well as water-repellency and easy sliding characteristics of the porous composite structure including slippery liquid may further be improved.

The base layer 10a and the pillar portion 10b having a plurality of nanorod shapes may be formed of the same material. The substrate 10 serves as a support having porosity, and the substrate 10 may include, for example, a metal, a metal oxide, a metal hydroxide, a polymer, a glass, a ceramic, or a combination thereof.

Examples of the metal may include copper, tungsten, aluminum, or silicon. Also, examples of the metal hydroxide may include copper hydroxide, and examples of the metal oxide may include copper oxide.

Examples of the polymer that may be used as the substrate 10 may include fluoropolymers, such as polytetrafluoroethylene (PTFE), polyvinylfluoride, polyvinylidene fluoride, fluorinated ethylene propylene, and polydimethylsiloxane. Examples of the ceramic may include alumina and silica.

Figure 1B:
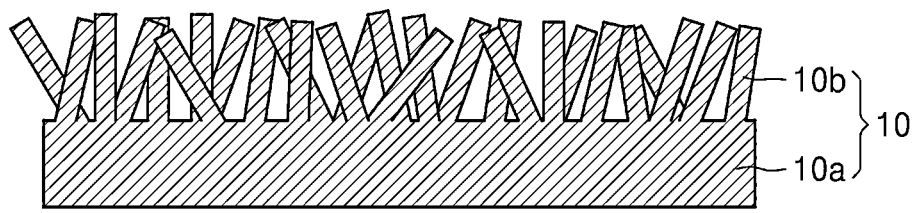
FIG. 1B illustrates a method of preparing the porous composite structure of FIG. 1A.

The substrate 10 having nanostructures may have nanoblade shapes as shown in FIG. 1B. The nanoblade shapes in FIG. 1B may have triangle-shaped structures that form ratchet structures. Also, the substrate 10a having nanostructures may also be in a template form including regular pores or random pores.

The SLIPS porous composite structure 1 may include a material (not shown) having an affinity for slippery liquid 12. The material having an affinity for slippery liquid 12 may be included in the inorganic particle layer 11. In an embodiment, the material having an affinity for slippery liquid may have a structure that is, e.g., may be, chemically bonded to the inorganic particle layer 11. In an embodiment, a part of the material having an affinity for slippery liquid 12 has a structure that is, e.g., may be, chemically bonded to the inorganic particle layer 11, and another part of the material having an affinity for slippery liquid 12 may exist without chemical binding in regions near the inorganic particle layer 11. The SLIPS porous composite structure 1 according to an embodiment may have a super water-repellent surface.

The slippery liquid 12 is included in the SLIPS porous composite structure 1, for example, as shown in FIG. 1A. Examples of the slippery liquid 12 may include silicon oil, fluorinated oil, paraffin-based oil, petroleum-based oil, olive oil, or a combination thereof.

When the SLIPS porous composite structure 1 according to an embodiment has the re-entrant structure by including the inorganic particle layer 11, the mechanical properties of the SLIPS porous composite structure 1 may be improved, and the chemical stability to an acid solution and durability of the SLIPS porous composite structure 1 may be improved.

Figure 2A:
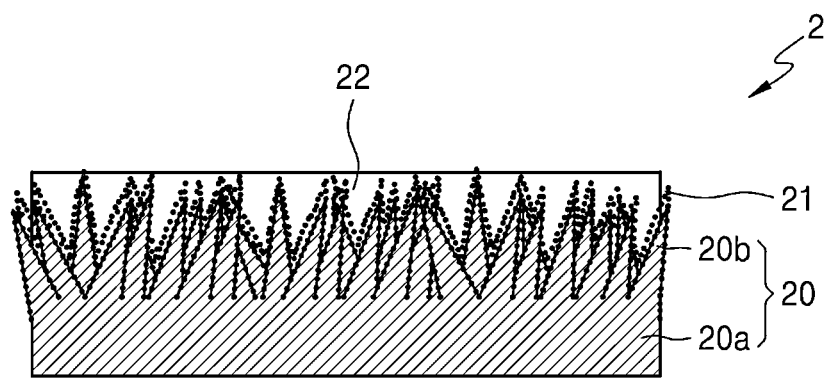
FIG. 2A is a schematic view of a structure of a porous composite structure according to an embodiment.
Figure 2B:
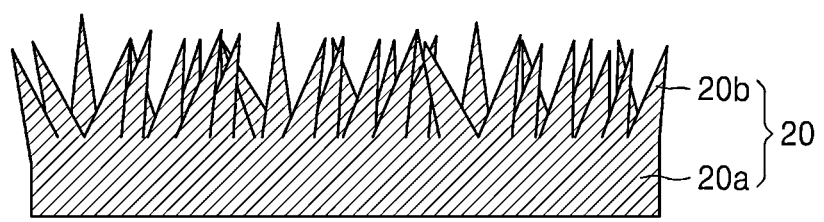
FIG. 2B illustrates a method of preparing the porous composite structure of FIG. 2A.
Figure 2C:
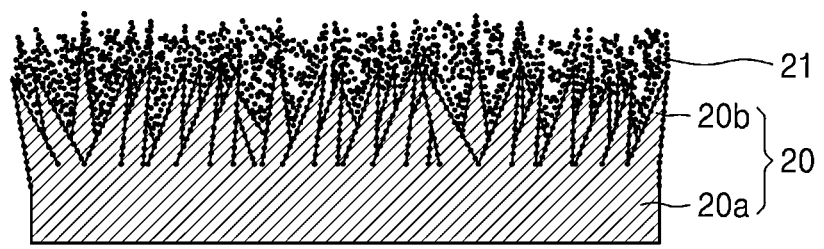
FIG. 2C illustrates a method of preparing the porous composite structure of FIG. 2A.

FIG. 2A is a schematic view of a structure of a SLIPS porous composite structure 2 according to an embodiment.

The SLIPS porous composite structure 2 of FIG. 2A is different from the SLIPS porous composite structure 1 of FIG. 1A in terms of having nanoblade shapes in a substrate 20. Referring to FIG. 2A, the substrate 20 includes a base layer 20a and a pillar portion 20b including a plurality of nanoblade shapes. A self-assembly layer (not shown) is on the substrate 20, and an inorganic particle layer 21 is on the self-assembly layer and the substrate 20. A material (not shown) having an affinity for slippery liquid and slippery liquid 22 are on the inorganic particle layer 21.

A method of preparing the porous composite structure, according to an embodiment, includes forming a particle layer on a substrate having nanostructures to form a first structure; and providing slippery liquid on the first structure.

The method may further include forming of an interlayer on the substrate having nanostructures before the forming of the particle layer on the substrate having nanostructures to prepare the first structure. The interlayer is a self-assembly layer or an adhesive layer, and the forming of the self-assembly layer is a process of, e.g., may include, coating the substrate with a compound of Formula 1.

The method may further include forming an interlayer on a substrate having nanostructures before the forming of the particle layer on the substrate having nanostructures to form the first structure, wherein the interlayer is a self-assembly layer, and the forming of the particle layer on the self-assembly layer to form the first structure includes repeatedly contacting negatively charged inorganic particles and positively charged inorganic particles on the self-assembly layer.

The negative charged inorganic particles may be negative charged colloidal silica, and the positively charged inorganic particles may be positively charged colloidal silica. The method may further include providing a material having an affinity for slippery liquid on the first structure before providing slippery liquid on the first structure.

According to an embodiment, a method of preparing the porous composite structure may include forming a self-assembly layer on a substrate having nanostructures; forming an inorganic particle layer on the self-assembly layer to form a first structure; providing a material having an affinity for slippery liquid on the first structure; and providing slippery liquid on the first structure onto which the material having an affinity for slippery liquid is provided.

The forming of the self-assembly layer may include a process of coating the substrate having nanostructures with a compound of Formula 1, which is aminosilane.

The aminosilane may include (3-aminopropyl)trimethoxysilane, (3-aminopropyltriethoxysilane, (2-aminoundecyl) trimethoxysilane, aminophenyl)trimethoxysilane, bis (trimethoxysilylpropyl) amine, N-(2-aminoethyl)-3-aminopropyltrimethoxysilane, or a combination thereof.

The inorganic particle layer may be formed by repeatedly contacting negatively charged inorganic particles and positively charged inorganic particles on a self-assembly layer to form an inorganic particle layer on the self-assembly layer.

The self-assembly layer may have a positive charge by containing water during the preparation process.

The forming of the inorganic particle layer on the self-assembly layer to prepare the first structure may include repeatedly contacting negatively charged inorganic particles and positively charged inorganic particles on the self-assembly layer to prepare an inorganic particle layer on the self-assembly layer.

The providing of the material having an affinity for slippery liquid is a process of, e.g., may include, coating the first structure with a fluorinated silane. Examples of the fluorinated silane may include trichloro(1H,1H,2H,2H-perfluorooctyl)silane, 1H,1H,2H,2H-perfluorodecyltriethoxysilane, or a combination thereof.

The method of preparing a porous composite structure may further include oxygen plasma treatment. The oxygen plasma treatment may be applied to a substrate having nanostructures or a structure having an inorganic particle layer. The oxygen plasma treatment may be performed between steps during the preparation of the porous composite structure as desired. When the oxygen plasma treatment is performed in this manner, impurities on the substrate having nanostructures or the structure having an inorganic particle layer may be removed. Also, a —OH group may be introduced to a surface of the substrate having nanostructures or the structure having an inorganic particle layer. When a —OH group is introduced in this manner, the —OH group may react with a functional group of the resultant structure provided in steps following thereafter.

Figure 1C:
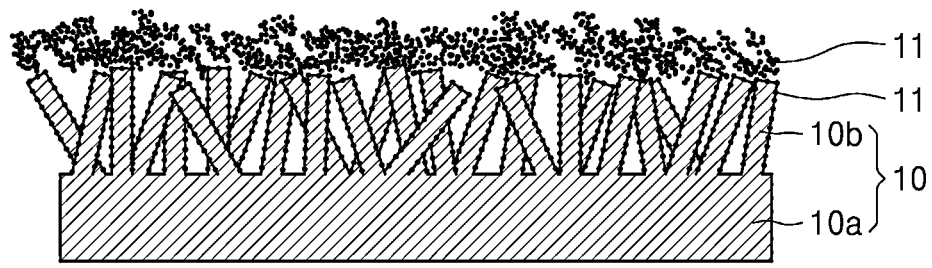
FIG. 1C illustrates a method of preparing the porous composite structure of FIG. 1A.

Referring to FIGS. 1B and 1C, a method of preparing the porous composite structure of FIG. 1A will be described in detail. As described in FIG. 1B, a substrate 10 having nanostructures is prepared.

The substrate 10 may be prepared by first removing impurities and a native oxide layer of the substrate 10 and performing an etching process on the substrate 10 for nanostructures.

The removing of the impurities on the substrate 10 may be performed by a sonication process using an organic solvent. Examples of the organic solvent may include ethanol and acetone. Also, the removing of a native oxide layer formed on the substrate may be performed using an acid solution. Examples of the acid solution may include a 1 moles per liter (molar (M)) to 3 M HCl solution. When the impurities and the native oxide layer formed on the surface of the substrate 10 are removed in this manner, a self-assembly layer and a silica layer prepared thereafter may be evenly formed, and adhesive strength between the self-assembly layer and the silica layer to the substrate may be improved.

The etching process to obtain a substrate having nanostructures may be performed by dry etching or wet etching. The dry etching may be performed using a reactive plasma/gas, and the wet etching may be performed using an appropriate etchant.

In an embodiment, the substrate having nanostructures may include a copper hydroxide or a copper oxide. For example, the substrate having nanostructures may include copper hydroxide nanorods, copper oxide nanoblades, or copper oxide nanoplates.

A self-assembly layer (not shown) may be formed on a, e.g., at least one, surface of the substrate 10. The self-assembly layer may be formed by coating aminosilane on the substrate 10.

The aminosilane may be a compound represented by Formula 1:

$$H_2N—R_1—Si(OR_2)_3 \qquad \text{Formula 1}$$

wherein, in Formula 1, $R_1$ may be a C1-C20 alkylene group or a C6-C20 arylene group, and $R_2$ may be hydrogen, a C1-C20 alkyl group, a C6-C20 aryl group, or Cl.

The C1-C20 alkyl group may be, for example, a C1-C10 alkyl group or may be, for example, a methyl group, an ethyl group, a propyl group, an isopropyl group, a butyl group, a pentyl group, or a hexyl group, and the C6-C20 aryl group may be, for example, a C6-C10 aryl group or may be, for example, a phenyl group.

Figure 5:
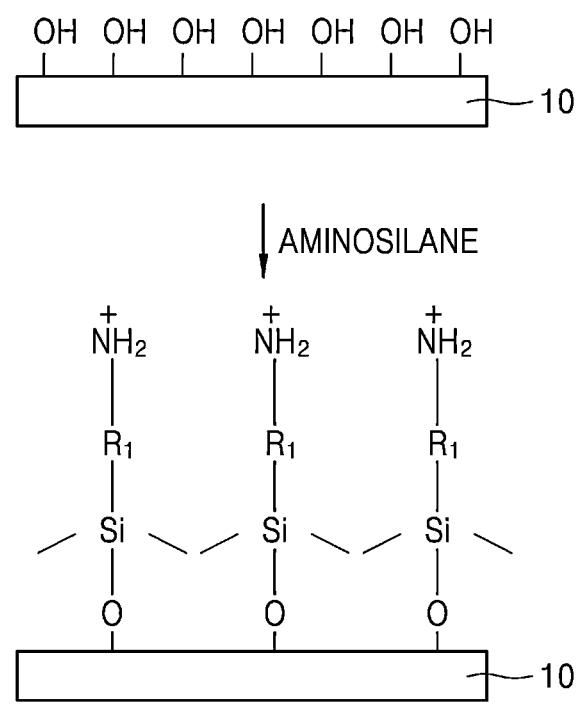
FIG. 5 shows a state of the porous composite structure according to an embodiment after performing aminosilane coating on a substrate having, e.g., including, nanostructures.

When the coating process uses aminosilane, a reaction between a hydroxyl group of the substrate and a functional group of aminosilane as a material for a self-assembled molecular layer may proceed to hydrolysis of aminosilane, and dehydration and condensation of the resultant structure of the hydrolysis, and thus, as shown in FIG. 5, a substrate having nanostructures may be obtained. The nanostructures include a self-assembly layer having a $H_2N(+)—R_1—Si(O)—$ network at the end thereof. The substrate having nanostructures and including a self-assembly layer has a positive charge on a surface thereof, and thus a silica layer may be formed using a layer-by-layer (LbL) assembly using positively charged colloidal silica particles and negatively charged colloidal silica particles.

The self-assembled molecular layer may be, for example, a self-assembled molecular monolayer.

As shown in FIG. 1C, the inorganic particle layer 11 may be formed as follows.

The inorganic particle layer 11 may be formed using a sol-gel method or a reaction using electrostatic attraction. An inorganic particle layer may be formed using an electrostatic force between two materials having opposite charges, and a porous composite structure having improved chemical stability, durability, and mechanical properties may be prepared. For example, the inorganic particle layer 11 may be prepared by forming an inorganic particle layer on a self-assembly layer by repeatedly contacting negatively charged inorganic particles and positively charged inorganic particles on a structure having a self-assembled molecular layer having a positive charge. An inorganic particle layer may be formed in a multi-layer structure by repeatedly contacting negatively charged inorganic particles and positively charged inorganic particles. A thickness of the inorganic particle layer 11 may be controlled by controlling the repetitive process. For example, a process of contacting negatively charged inorganic particles and positively charged inorganic particles may be one process, which may be repeated 8 to 12 times in total, for example, 10 times, to prepare a porous composite structure having improved durability.

After contacting the structure having a positively charged self-assembled molecular layer and negatively charged inorganic particles, the structure may undergo a washing process. Through the washing process, impurities such as excessive negatively charged inorganic particles after the reaction may be removed. The washed structure may be contacted with positively charged inorganic particles. Then, after performing the washing process again, the process of contacting negatively charged inorganic particles and positively charged inorganic particles may be repeated.

The negatively charged inorganic particles may be, for example, negatively charged colloidal silica, and the positively charged inorganic particles may be, for example, positively charged colloidal silica.

Subsequently, a material (not shown) having an affinity for slippery liquid may be provided to the resultant structure. The material having an affinity for slippery liquid may be, for example, a fluorinated silane. The fluorinated silane may have a hydrolyzable functional group and fluorine or a fluorine-containing functional group. The hydrolyzable functional group may be, for example, a hydroxy group or an alkoxy group. Examples of the fluorinated silane may include trichloro(1H,1H,2H,2H-perfluorooctyl)silane, 1H,1H,2H,2H-perfluorodecyltriethoxysilane, or a combination thereof.

The providing of the fluorinated silane may be performed, for example, in a vacuum condition.

An amount of the fluorinated silane may be controlled to be in a concentration range of about 1 weight % to about 5 weight %.

Then, the resultant structure provided with liquid may be washed using ethanol, and slippery liquid may be provided thereto to prepare a SLIPS porous composite structure. Examples of a method of providing slippery liquid may include flow coating and spray coating.

A contact angle of the SLIPS porous composite structure according to an embodiment with respect to water and an organic solvent may be about 170° or greater, and a sliding angle thereof may be about 10° or less. The organic solvent may be, for example, glycerol, diiodomethane, or a combination thereof. The SLIPS porous composite structure according to an embodiment has these characteristics, and a material condensed by external flow may be easily separated from the substrate. When the SLIPS material is used, stability and long-term persistence of the system may be excellent due to excellent durability of the material with respect to infusion and elution of slippery liquid. Also, a gas-liquid contact layer of a filter-less air purifier that may be utilized in water/oil vapor environments may be manufactured. Droplets in the gas-liquid contact layer may be quickly discharged, and an increase in pressure difference in the gas-liquid contact layer may be effectively suppressed.

The SLIPS porous composite structure according to an embodiment may be provided on a surface of a flow channel, on a surface of an optical component, on a surface of a sign or a commercial graphic, on a surface of a building material, on a surface of a cooling element, on a surface of a heat exchanger, in a fluid transfer apparatus, on a surface of a wind mill, on a surface of a turbine, on a surface of a solar cell, on a surface of an avionic device, on a surface of a marine vessel or on a surface of an underwater device, or on a surface of a fabric.

According to an embodiment, an article includes the SLIPS porous composite structure according to an embodiment.

The article may be useful in a heat exchanger, pipes, exhaust gas, an anti-corrosion device, energy-efficient fluid handling and transportation, optical sensing, medicine, as self-cleaning and anti-fouling materials, solar cells, roof tiling, and anti-fouling materials operating in extreme environments. The article produced may be utilized in various industries for removal of ice on a surface of a machine, such as an aircraft or an automobile, a biofouling problem in a blood vessel, and areas of self-cleaning.

A surface of slippery liquid of the article may be arranged to be in contact with a foreign material of interest, wherein the slippery liquid is immiscible to the foreign material, and the foreign material has almost none or completely no adhesion to the article.

According to an embodiment, an air purifier includes the SLIPS porous composite structure according to an embodiment.

The air purifier according to an embodiment includes a duct through which air including micro-dusts flows; a droplet sprayer which sprays water inside the duct to form a gas-liquid mixture fluid and to collect micro-dusts in the air; and a dust collector including a porous member forming, e.g., including, micro-channels through which the gas-liquid mixture fluid passes and collecting the droplets including the micro-dusts. The air purifier may further include a discharge plasma generating device that generates a discharge plasma in the dust collector. Also, the air purifier may further include a catalyst reactor capable of removing ozone discharged from the dust collector using a catalyst.

The air purifier according to an embodiment may be usefully utilized in water/oil vapor environments by including the porous composite structure according to an embodiment, for example, the SLIPS porous composite structure. The air purifier according to an embodiment purifies air by collecting particulate matter in gas, for example, air and may be applied to an industrial dust collecting facility, an in-building air-conditioning/ventilation system, etc. Also, the air purifier is filter-less, and there is no need to replace or manage a filter. Micro-dusts and contaminant materials are ionized or decomposed by a discharge plasma and are captured in liquid passing the reactor to be easily discharged from the reactor. Micro-dusts and contaminant materials in the air may be relatively easily collected in liquid to be discharged to the outside, and the air purifier may exercise, e.g., exhibit, excellent performance in removing contaminant materials. Also, the liquid in which micro-dusts and contaminant materials are captured may be easily discharged from a reactor, and the burden of periodic maintenance or replacement of the reactor may be reduced.

A structure of the air purifier according to an embodiment will be described with reference to the attached drawings.

Figure 10:
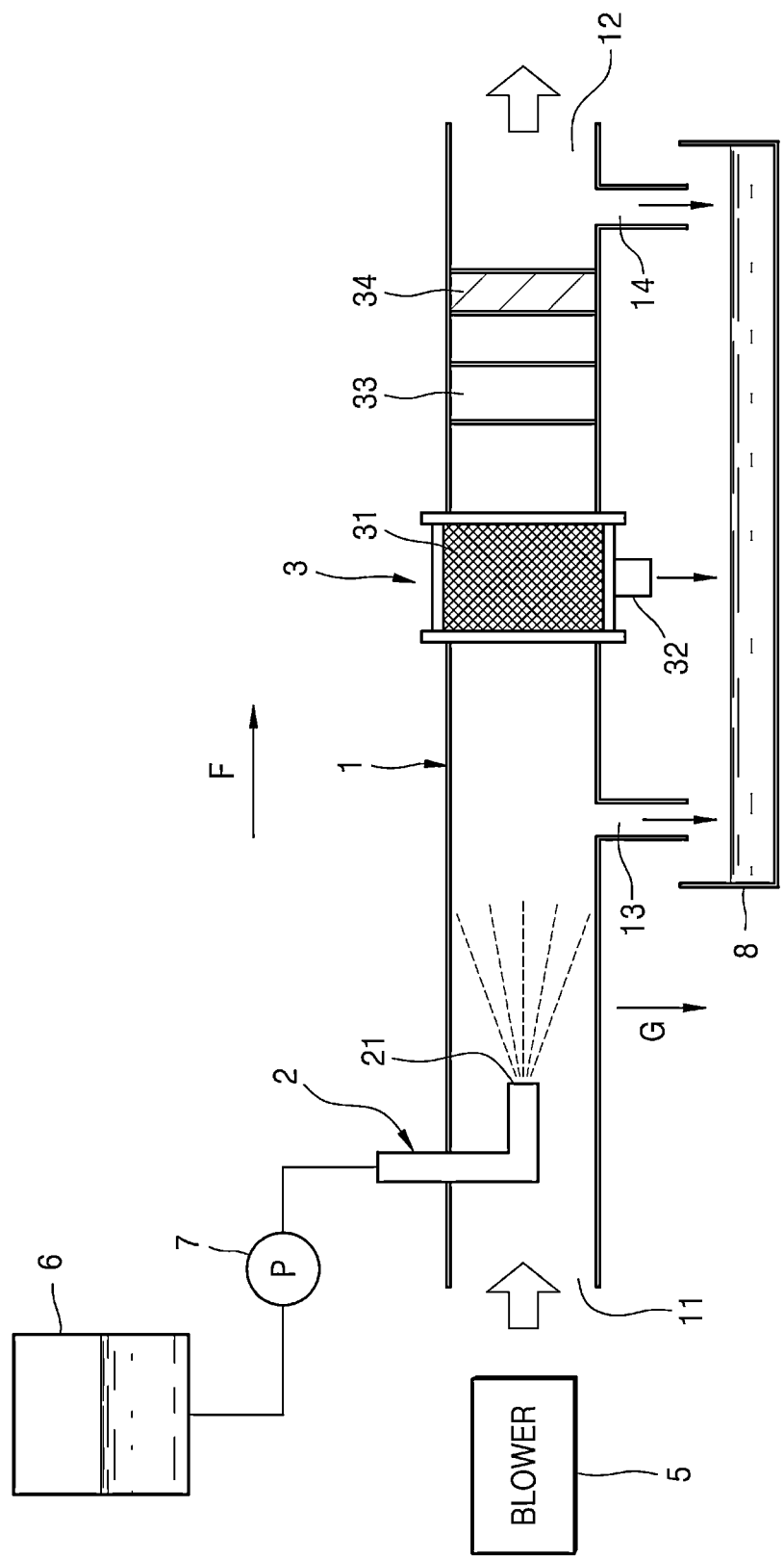
FIG. 10 is a schematic view of an air purifier according to an embodiment.

Referring to FIG. 10, the air purifier may include: a duct 1 through which air including micro-dusts flows; a droplet sprayer 2 which sprays water inside the duct 1 to collect the micro-dusts in the air; and a dust collector 3 forming, e.g., including, micro-channels 31 through which a gas-liquid mixture fluid passes and collecting droplets including the micro-dusts. Surfaces of the micro-channels 31 are incompatible with liquid. For example, a liquid-incompatible coating layer may be formed on the surfaces of the micro-channels 31.

The duct 1 forms an air flow path. The shape of the duct 1 is not particularly limited. For example, a cross-sectional shape of the duct 1 may be various shapes, such as circle or polygon. The cross-sectional shape of the duct 1 of an embodiment is a quadrangle. For example, air containing micro-dusts is supplied to the duct 1 through an inlet 11 by a blower 5. The air flows along the air flow path formed by the duct 1 to be discharged through an exit 12.

The droplet sprayer 2 sprays droplets, e.g., water, inside the duct 1. The droplet sprayer 2 may include one or more spray nozzles 21. For example, water stored in a water tank 6 is pressurized by a pump 7 to be sprayed inside the duct 1 as fine droplets through the spray nozzles 21. A part of micro-dusts in the air is collected by the droplets. A gas-liquid mixed fluid in which air and droplets are mixed is formed in the duct 1. The gas-liquid mixed fluid flows from the inlet 11 to the exit 12 along the air flow path defined by the duct 1.

The dust collector 3 has, e.g., includes, the plurality of micro-channels 31. The gas-liquid mixed fluid passes through the plurality of micro-channels 31. Some of the droplets including micro-dusts collide and attach to surfaces of the micro-channels 31 while the gas-liquid mixed fluid passes the plurality of micro-channels 31. Some of the droplets not including micro-dusts also collide and attach to the surfaces of the micro-channels 31. A liquid film is formed on the surfaces of the micro-channels 31 by the droplets. The micro-dusts not captured by the droplets are captured in the liquid film by contacting the liquid film formed on the surfaces of the micro-channels 31 while the micro-dusts pass the plurality of micro-channels 31. The liquid film, for example, flows downward along the surfaces of the micro-channels 31 by gravity. The dust collector 3 may include an outlet 32 through which liquid flowing down from the plurality of micro-channels 31 is discharged. The micro-dusts captured in the droplets are discharged with the droplets through the outlet 32 from the dust collector 3. In an embodiment, the micro-channels 31 may not be linearly extended in the direction of air flow. The micro-channels 31 may be curved, a contact area between the surfaces of the micro-channels 31 and the droplets may be increased, and thus the droplets may be easily captured on the surfaces of the micro-channels 31.

The duct 1 may be provided with one or more outlets 13 and 14. When the gas-liquid mixed fluid collides with an inner wall of the duct 1, a liquid film may be formed at the inner wall of the duct 1, and micro-dusts may be collected by the liquid film. The liquid film flows down along the inner wall of the duct 1 in the gravity direction G, and is discharged outside the duct 1 through the outlets 13 and 14. For example, the outlet 13 may be arranged between the droplet sprayer 2 and the dust collector 3. The outlet 14 may be arranged at a downstream side of the dust collector 3. Liquid discharged through the outlets 13 and 14 and the outlet 32 of the dust collector 3 may be stored in a collection tank 8.

A pressure drop may occur while the gas-liquid mixed fluid passes through the dust collector 3. The pressure drop is a difference between a pressure of an upstream side of the dust collector 3 and a pressure of a downstream side of the dust collector 3, which is also referred to as a differential pressure. The increase in the differential pressure reduces energy efficiency of the air purifier and increases the running cost. The liquid film collected on the surfaces of the micro-channels 31 reduces a cross-sectional area of the micro-channels 31, which may become a cause of an increase in the differential pressure.

The increase in the differential pressure may be minimized or prevented by rapidly separating the liquid film from the surfaces of the micro-channels 31. In an embodiment, the surfaces of the micro-channels 31 may be prepared to have phobic properties to liquid being sprayed from the droplet sprayer 2. Contact angles of the droplets to the surfaces of the micro-channels 31 may be increased, and thus the droplets may be easily separated from the surfaces of the micro-channels 31. The liquid-incompatibility of the surfaces of the micro-channels 31 may be expressed by contact angles of the droplets to the surfaces of the micro-channels 31. For example, the droplet sprayer 2 may spray water into the air, and the micro-channels 31 may be formed of the porous composite structure according to an embodiment. Liquid is easily separated from the surfaces of the micro-channels 31, and a range of a porosity of the dust collector 3 that may control the pressure difference, i.e., pressure drop, between the upstream and downstream sides of the dust collector 31 may be widened. Pressure drop may be reduced compared to a filtering method, and energy consumption of the air purifier may be reduced. Also, the contact probability between the micro-channels 31 and micro-dusts and droplets may increase in the air purifier, the air purifier may obtain air purification efficiency higher than a filtering method. Also, unlike a filtering method, the droplets containing micro-dusts are easily separated from the surfaces of the micro-channels 31, the micro-channels 31 are not clogged even when used for a long time, and the burden of periodic maintenance or replacement of the dust collector 3 may be reduced. In some cases, the dust collector 3 may not need to be replaced.

The contact angle may be increased when an area of the surfaces of the micro-channels 31 increases, and separation of the droplets from the surfaces of the micro-channels 31 may further be facilitated. For this, an unevenness treatment may be performed on the surfaces of the micro-channels 31. The unevenness treatment may be performed by, for example, an etching process.

A structure of the micro-channels 31 is not particularly limited. As the contact area of the micro-channels 31 increases, a contact rate between the gas-liquid mixed fluid and the surfaces of the micro-channels 31 is increased, and the micro-dust-collecting performance of the air purifier may be improved. In an embodiment, the dust collector 3 may include a porous member forming the micro-channels 31. The dust collector 3 may include a plurality of fillers forming the micro-channels 31. Hereinafter, an embodiment of the dust collector 3 will be described.

A discharge plasma generating apparatus 33 generating a discharge plasma in the dust collector 3 may be placed in the air purifier of FIG. 10. When the discharge plasma generating apparatus 33 is used, a discharge region from which a discharge plasma is produced may be formed in the dust collector 3. Ozone ($O_3$) may be produced from oxygen ($O_2$) in the air by the discharge plasma generating apparatus 33.

A catalyst reactor 34 may be arranged at the back end of the dust collector 3 to remove ozone using a catalyst discharged from the dust collector 3. For example, the catalyst in the catalyst reactor 34 may include a metal oxide or a metal nitride, for example, a manganese oxide, a copper oxide, an aluminum oxide, a titanium oxide, or a combination thereof.

As described above, decomposition by a discharge plasma and collection by liquid are simultaneously applied to the air purifier 1 according to an embodiment to purify contaminated air. Hereinafter, purification of contaminated air ($Air_1$) using a discharge plasma and liquid by separating micro-dusts (PM), a water-soluble organic compound, a water-insoluble organic compound, and ozone will be described in detail.

Figure 11:
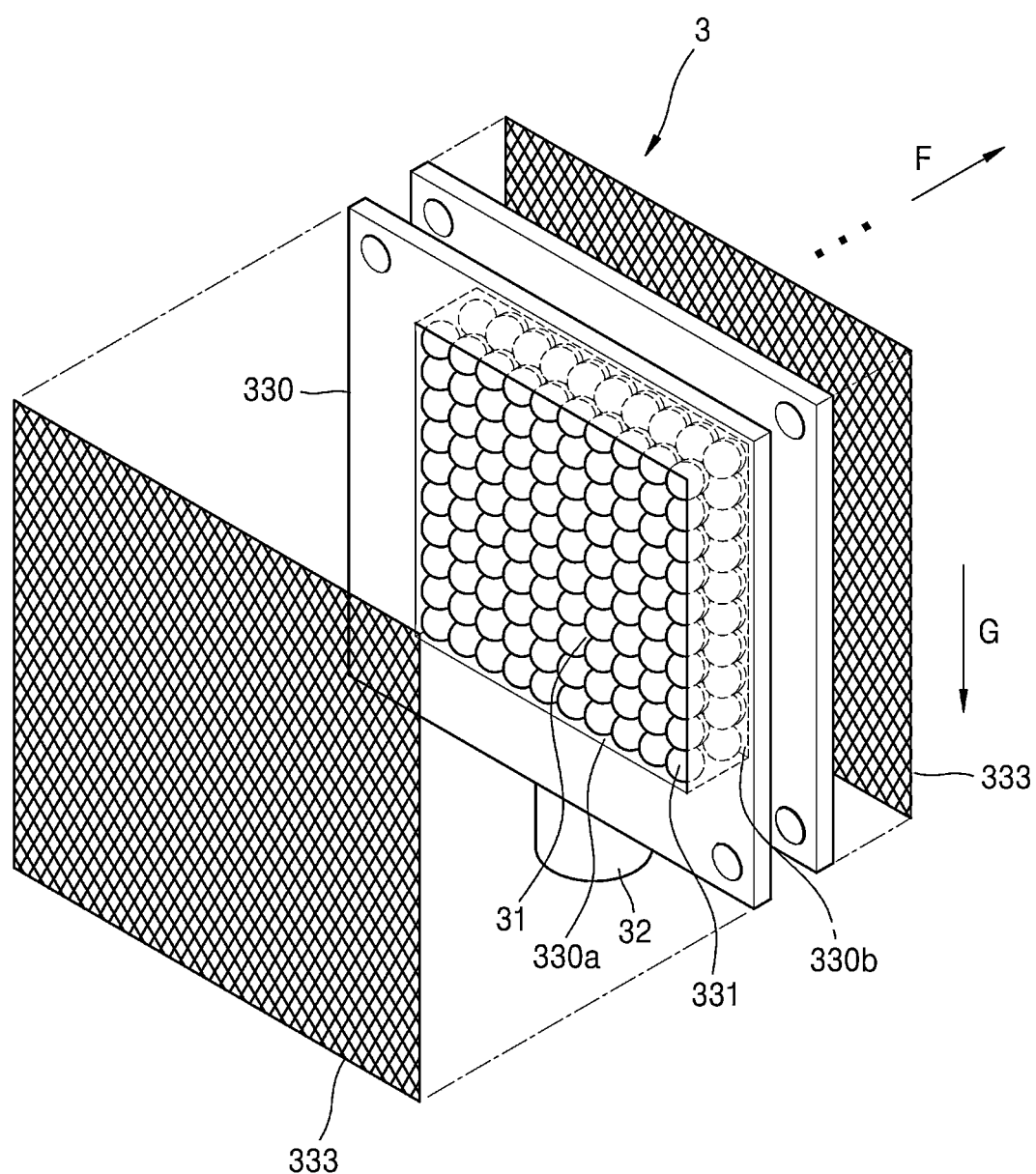
FIG. 11 is a schematic perspective view illustrating an example of a dust collector in the air purifier of FIG. 10.

FIG. 11 is a schematic perspective view illustrating an example of the dust collector 3. Referring to FIG. 11, a porous member may include a housing 330; and a plurality of fillers 331 being filled in housing 330. Micro-channels 31 may be formed by gaps between the plurality of micro-channels 31. An outlet 32 through which droplets collected on surfaces of the plurality of fillers 331 is prepared in the housing 330. The housing 330 may include an inlet 330a through which a gas-liquid mixed fluid is introduced and an exit 330b through which a gas-liquid mixed fluid is discharged. A mesh screen 333 may be arranged at each of the inlet 330a and the exit 330b.

The fillers 331 may be, for example, beads. Beads may be formed of, for example, glass or metal. Diameters of a plurality of beads may be regular or irregular. The plurality of beads may be packed regularly or irregularly in the housing 330. The plurality of beads may be stacked in one or more layers in a flow direction F of the gas-liquid mixed fluid. The micro-channels 31 may be defined by pores between the plurality of beads. Each of the plurality of beads may have a spherical body as shown in FIG. 11. The diameter of the plurality of beads may be the same. The plurality of beads may be packed in the housing 330 in various shapes. Packing shapes of the plurality of beads may be various shapes, for example, a primitive centered cubic ("PCC") structure, a face-centered cubic ("FCC") structure, a body-centered cubic ("BCC") structure, and a hexagonal closed-packed ("HCP") structure. The porosity of the PCC structure is about 48.6 percentage (%). The porosity of the FCC structure is about 26%. The porosity of the BCC structure is about 32%. The plurality of micro-channels 31 may be defined by at least three adjacent beads. The plurality of beads may be stacked in two or more layers to increase a contact probability between the gas-liquid mixed fluid and the plurality of beads while passing through the micro-channels 31. The cross-sectional area of the plurality of micro-channels 31 is repeatedly contracted and expanded at least once in the flow direction F of the gas-liquid mixed fluid between the inlet 330a and the exit 330b. Accordingly, the probability of contact between the gas-liquid mixed fluid and the plurality of beads increases, and thus the micro-dust collection efficiency may be improved. The fillers 331 may be raschig rings as shown in FIG. 11. The plurality of raschig rings may be regularly or irregularly packed in the housing 330.

The gas-liquid mixed fluid may pass through the micro-channels 31 formed by the plurality of fillers 331, and droplets may be collected on surfaces of the micro-channels 31, i.e., surfaces of the fillers 331. The droplets drop in the gravity direction G. The surfaces of the fillers 331 may be treated to be incompatible with droplets so that the droplets may be easily separated from the surfaces of the fillers 331. For example, the fillers 331 may be formed using the porous composite structure according to an embodiment.

An unevenness treatment may be performed on the surfaces of the fillers 331. The mesh screen 333 may be formed using the SLIPS porous composite structure according to an embodiment. An unevenness treatment may be performed on the mesh screen 333. A porous member may include a plurality of housings 330 arranged in the air flow direction F; and fillers 331 that are filled in the plurality of housings 330. Diameters of the fillers 330 packed in the plurality of housings 330 may be the same or may not be the same.

In an embodiment, the porous composite structure according to an embodiment, for example, a SLIPS porous composite structure, may be formed on a surface of a porous substrate such as a mesh screen or foam.

Hereinafter, examples will be described in detail. The examples are provided for illustrative purposes only and are not intended to limit the scope of the present disclosure.

EXAMPLE

Example 1: Preparation of Slippery Liquid Infused Porous Surface (SLIPS) Porous Composite Structure Using $Cu(OH)_2$ Nanorods A Cu plate (in a size of 20 millimeters (mm)×100 mm×2 mm) was sonicated for 15 minutes in a mixture solution prepared by mixing ethanol and acetone in a volume ratio of 1:1, to remove impurities. Subsequently, the resultant structure was dried and impregnated with a 2 moles per liter (molar (M)) HCl solution for 10 minutes to remove a native oxide layer formed on the surface of the Cu plate, thereby performing pre-treatment on the Cu plate.

The Cu plate thus pre-treated was impregnated with a mixture solution including 2.5 M NaOH and 0.1 M $(NH_4)_2S_2O_8$ for 10 minutes, and then thus obtained sample was sufficiently washed with deionized (DI) water to prepare $Cu(OH)_2$ nanorods.

After performing oxygen plasma treatment on the $Cu(OH)_2$ nanorods, the $Cu(OH)_2$ nanorods were impregnated with a solution of (3-aminopropyl)triethoxysilane (APTES)/ethanol (EtOH) for 24 hours. Next, a sample was collected from the resultant structure, washed with a large amount of ethanol, and dried to prepare a structure having a self-assembly layer on the $Cu(OH)_2$ nanorods. The self-assembly layer contains a hydrolysis product of (3-aminopropyl)triethoxysilane, a dehydration product of the hydrolysis product, and condensation reaction of the dehydration product, and this is formed by a functional group (H) of the hydrolysis product and a OH group of the dehydration condensation of $Cu(OH)_2$ nanorods.

The structure having the self-assembly layer was impregnated with a negatively charged colloidal silica particle dispersion (LUDOX HS, available from Aldrich) for 1 minute and then was washed. Then, the washed resultant structure was impregnated with a positively charged colloidal silica particle dispersion (LUDOX CL, available from Aldrich) for 1 minute and then was washed. The process of impregnating/washing using the negatively charged colloidal silica and the positively charged colloidal silica was repeated 10 times to prepare a structure including a self-assembly layer and a silica layer that are located on $Cu(OH)_2$ nanorods.

Oxygen plasma treatment was performed on the structure, and then the structure and 0.2 mL of trichloro(1H,1H,2H,2H-perfluorooctyl)silane) (PFOTS) were located in a sealed desiccator. Thereafter, the desiccator was maintained a vacuum state at −0.97 bar using a vacuum pump for 20 minutes, and then PFOTS coating was performed on the structure. The obtained sample was washed with ethanol and then dried at 75° C. for 1 hour to prepare a PFOTS-coated structure.

A fluorinated synthetic oil (Krytox GPL 103 oil) as a slippery liquid was provided to the dried resultant structure, the oil was evenly dispersed on a surface of the structure using an air gun, and then the structure was vertically hanged to remove excessive slippery liquid, thereby preparing a SLIPS porous composite structure ($FL-SiO_2-Cu(OH)_2$). In $FL-SiO_2-Cu(OH)_2$, FL represents PFOTS, $SiO_2$ represents a silica layer, and $Cu(OH)_2$ represents $Cu(OH)_2$ nanorods.

Example 2: Preparation of SLIPS Porous Composite Structure Using CuO Nanoblades

A Cu plate (in a size of 20 mm×100 mm×2 mm) was sonicated for 15 minutes in a mixture solution prepared by mixing ethanol and acetone in a volume ratio of 1:1, to remove impurities. Subsequently, the resultant structure was dried and impregnated in a 2 M HCl solution for 10 minutes to remove a native oxide layer, thereby performing pre-treatment on the Cu plate.

The pretreated Cu plate was impregnated with a mixture solution including sodium chlorite ($NaClO_2$), NaOH, sodium phosphate ($Na_3PO_4.12H_2O$), and deionized water in a weight ratio of 3.75:5:10:100 at a temperature of 95° C. to 97° C. for 10 minutes. The obtained sample was sufficiently washed with deionized (DI) water and dried at a temperature of about 120° C. to prepare CuO nanoblades.

A SLIPS porous composite structure ($FL-SiO_2-CuO$) was prepared in the same manner as in the processes of forming a self-assembly layer and a silica layer and impregnating with a slippery liquid in Example 1, except that CuO nanoblades were used instead of $Cu(OH)_2$ nanorods.

Comparative Example 1

A Cu plate (in a size of 20 mm×100 mm×2 mm) was sonicated for 15 minutes in a mixture solution prepared by mixing ethanol and acetone in a volume ratio of 1:1, to remove impurities. Subsequently, the resultant structure was dried and impregnated with a 2 M HCl solution for 10 minutes to remove a native oxide layer, thereby performing pre-treatment on the Cu plate.

The Cu plate thus pre-treated was impregnated with a mixture solution including 2.5 M NaOH and 0.1 M $(NH_4)_2S_2O_8$ for 10 minutes, and then thus obtained sample was sufficiently washed with deionized (DI) water to prepare $Cu(OH)_2$ nanorods.

Oxygen plasma treatment was performed on the $Cu(OH)_2$ nanorods, and then the oxygen plasma-treated $Cu(OH)_2$ nanorods and 0.2 mL of trichloro(1H,1H,2H,2H-perfluorooctyl)silane) (PFOTS) were located in a sealed desiccator. Thereafter, the desiccator was maintained a vacuum state at −0.97 bar using a vacuum pump for 20 minutes, and then PFOTS coating was performed on the $Cu(OH)_2$ nanorods. The obtained sample was washed with ethanol and then dried at about 75° C. for 1 hour to prepare a PFOTS-coated structure.

A fluorinated synthetic oil (Krytox GPL 103 oil) as a slippery liquid was provided to the dried resultant structure, the oil was evenly dispersed on a surface of the structure using an air gun, and then the structure was vertically hanged to remove excessive slippery liquid, thereby preparing a slippery liquid infused structure ($FL-Cu(OH)_2$).

Comparative Example 2

A Cu plate (in a size of 20 mm×100 mm×2 mm) was sonicated for 15 minutes in a mixture solution prepared by mixing ethanol and acetone in a volume ratio of 1:1, to remove impurities. Subsequently, the resultant structure was dried and impregnated with a 2 M HCl solution for 10 minutes to remove a native oxide layer, thereby performing pre-treatment on the Cu plate.

The pretreated Cu plate was impregnated with a mixture solution including sodium chlorite ($NaClO_2$), NaOH, sodium phosphate ($Na_3PO_4.12H_2O$), and deionized water in a weight ratio of 3.75:5:10:100 at a temperature of 95° C. to 97° C. for 10 minutes. The obtained sample was sufficiently washed with deionized (DI) water to prepare CuO nanoblades.

A slippery liquid infused structure (FL-CuO) was prepared in the same manner as in the processes of forming a silica layer and impregnating with a slippery liquid in Comparative Example 1, except that CuO nanoblades were used instead of $Cu(OH)_2$ nanorods.

Evaluation Example 1: Sand Abrasion Test

A sand abrasion test was performed on the SLIPS porous composite structure of Examples 1 and 2 and the structures of Comparative Examples 1 and 2. The sand abrasion test was carried out while tilting each of the sample 45° and then dropping 5 g of sea sand in a size of 30 mesh to 50 mesh from a height of 1 m.

Figure 3A:
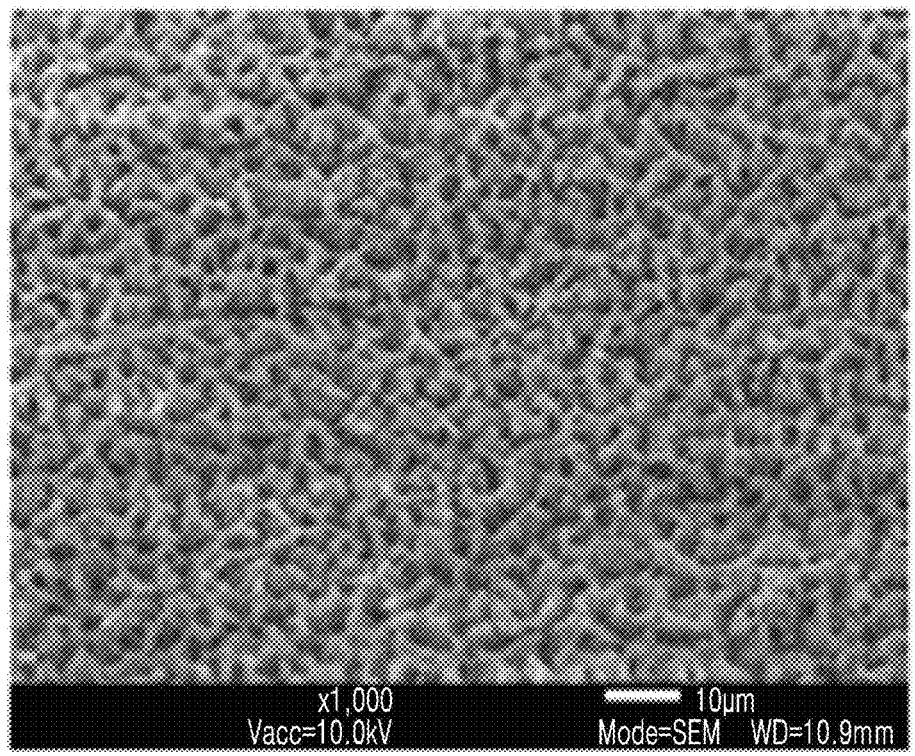
FIG. 3A shows the result of a sand abrasion test performed on a porous composite structure of Example 1.
Figure 3B:
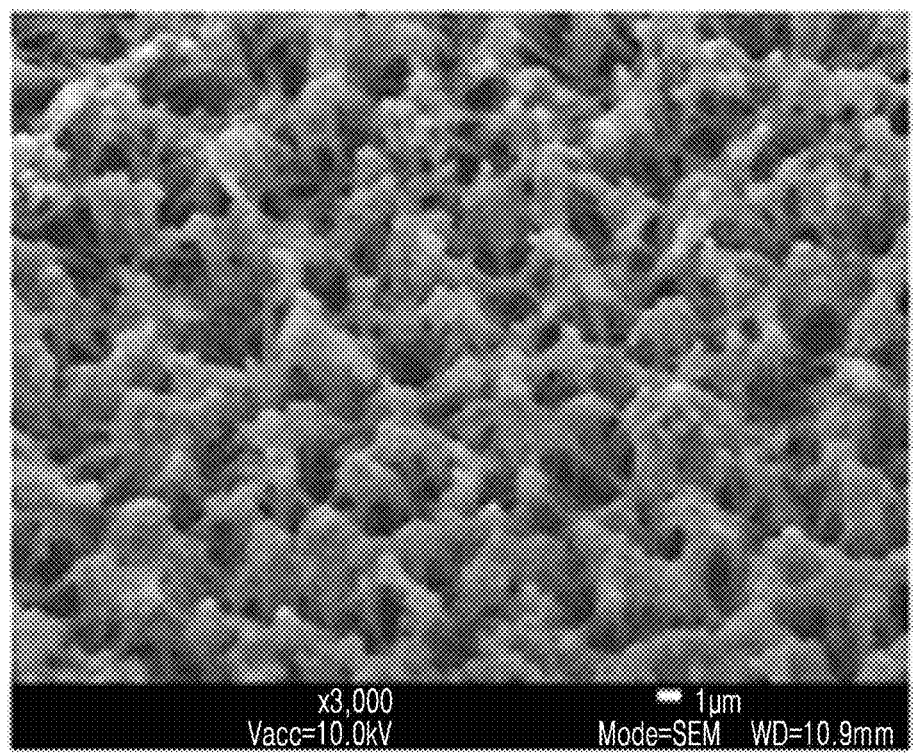
FIG. 3B shows the result of a sand abrasion test performed on a porous composite structure of Example 1.
Figure 3C:
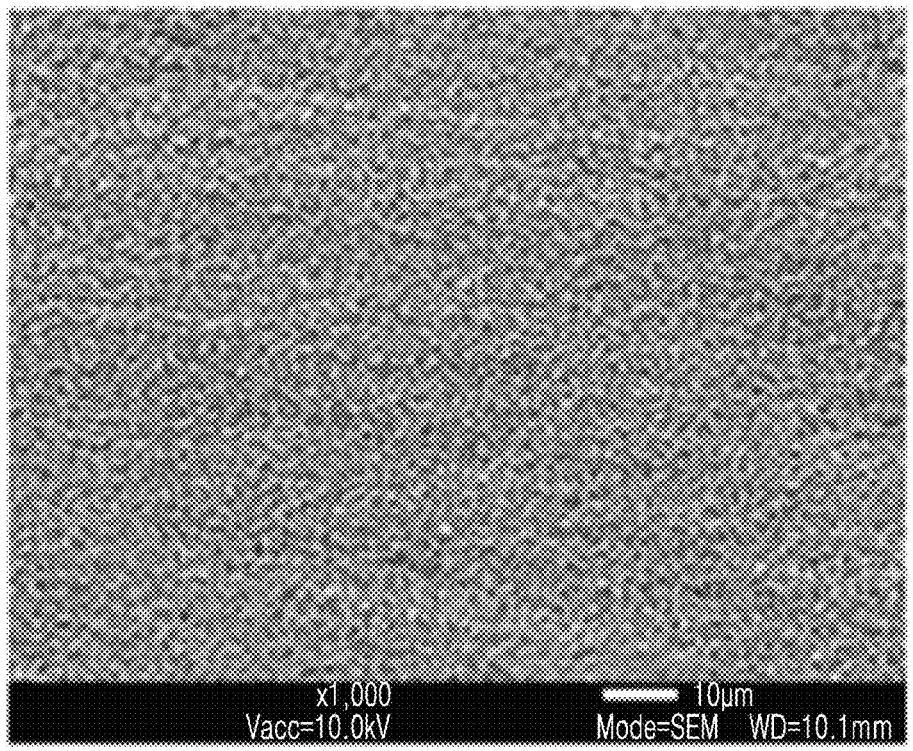
FIG. 3C shows the result of a sand abrasion test performed on a porous composite structure of Example 2.
Figure 3D:
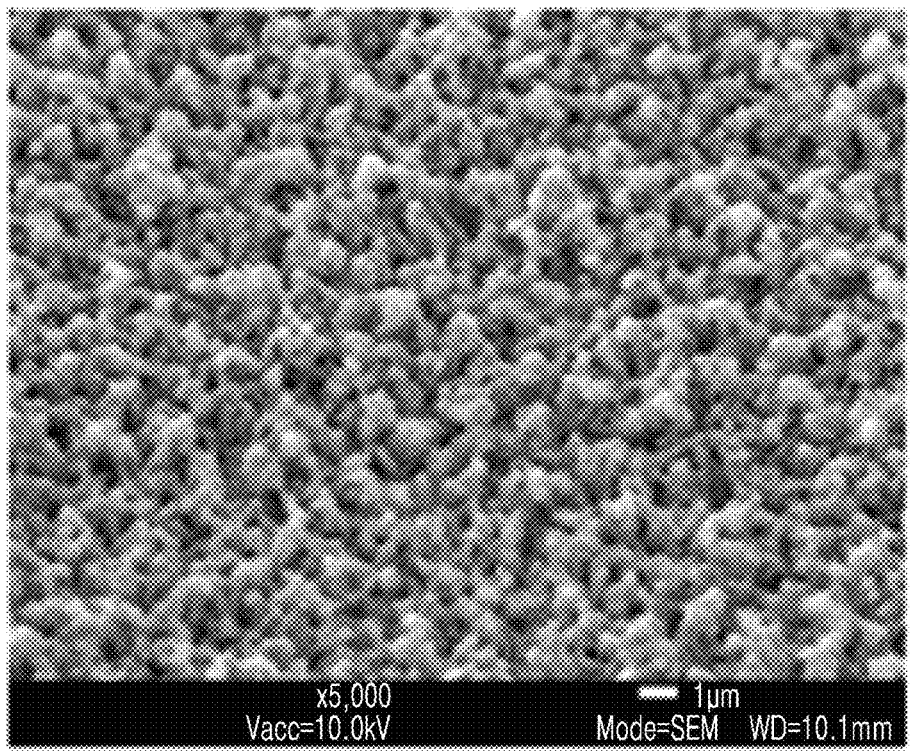
FIG. 3D shows the result of a sand abrasion test performed on a porous composite structure of Example 2.
Figure 4A:
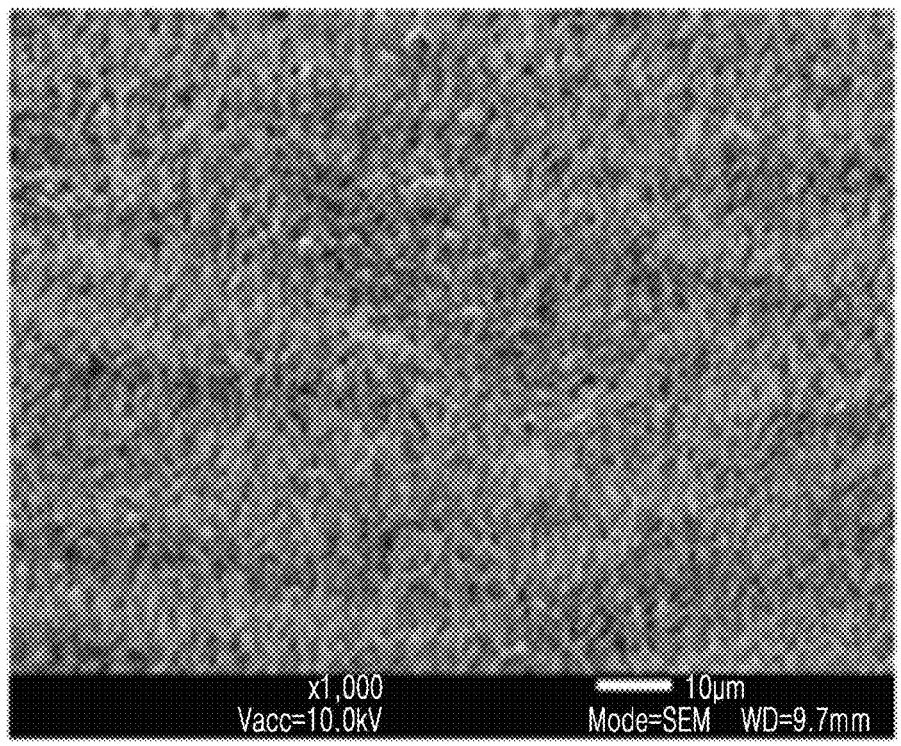
FIG. 4A shows the result of a sand abrasion test performed on a porous composite structure of Comparative Example 1.
Figure 4B:
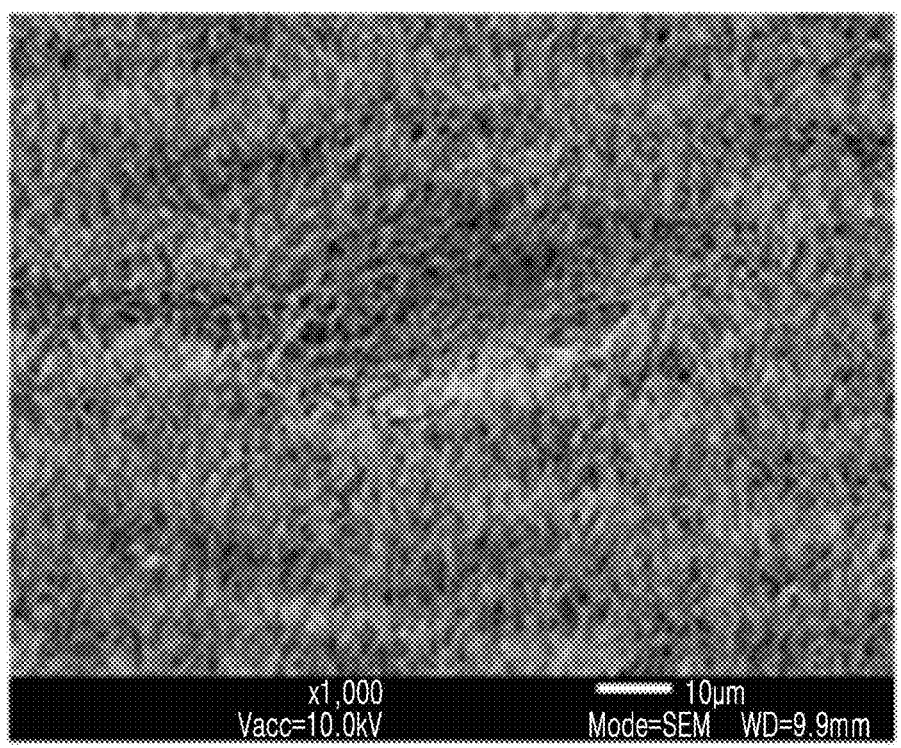
FIG. 4B shows the result of a sand abrasion test performed on a porous composite structure of Comparative Example 1.
Figure 4C:
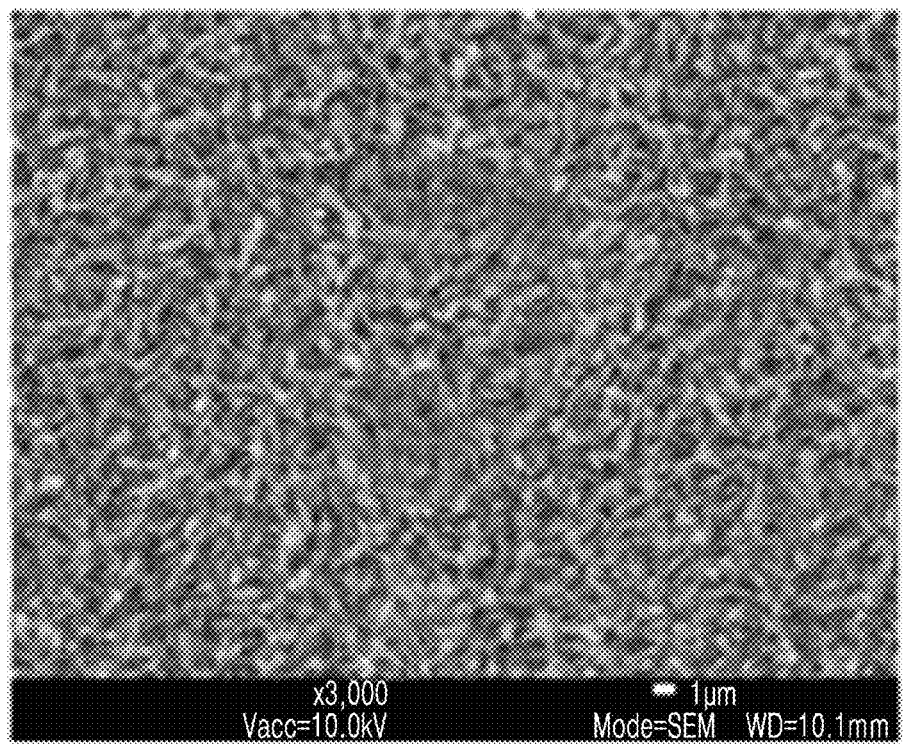
FIG. 4C shows the result of a sand abrasion test performed on a porous composite structure of Comparative Example 2.
Figure 4D:
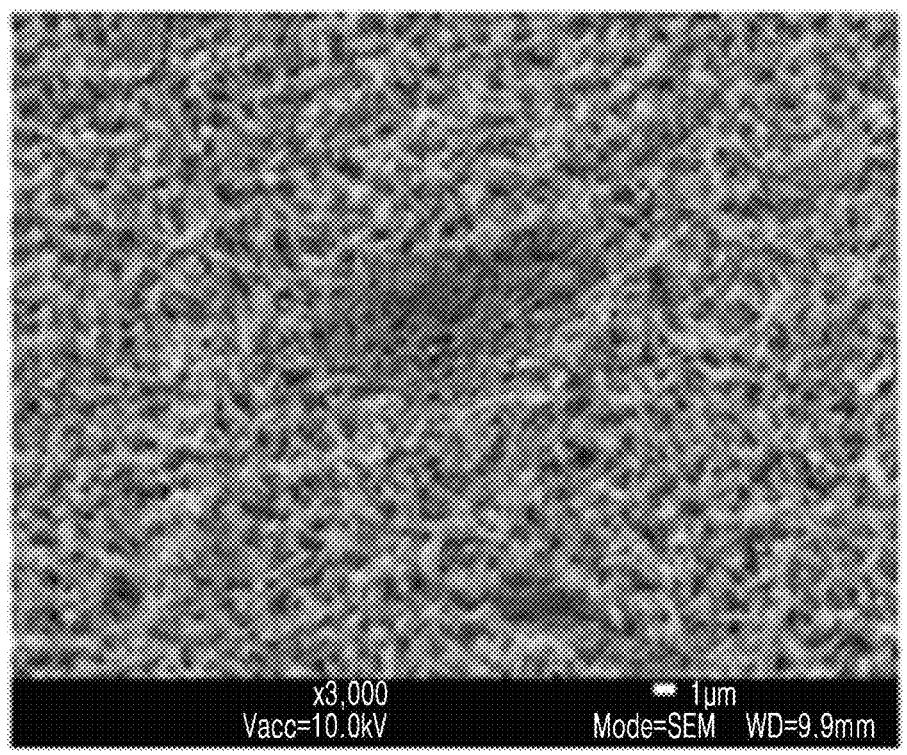
FIG. 4D show the result of a sand abrasion test performed on a porous composite structure of Comparative Example 2.

The results of the sand abrasion test are shown in FIGS. 3A, 3B, 3C, 3D, 4A, 4B, 4C, and 4D. FIGS. 3A and 3B show the results of the sand abrasion test of the porous composite structure of Example 1, and FIGS. 3C and 3D show the results of the sand abrasion test of the porous composite structure of Example 2. Also, FIGS. 4A and 4B show the results of the sand abrasion test of the structure of Comparative Example 1, and FIGS. 4C and 4D show the results of the sand abrasion test of the structure of Comparative Example 2.

Referring to FIGS. 3A to 3D and 4A to 4D, the porous structures of Comparative Examples 1 and 2 had significant surface condition change after the sand abrasion test as shown in FIGS. 4A to 4D. In contrast, SLIPS surfaces of the SLIPS porous composite structures of Examples 1 and 2 maintained the original surface structures even after the sand abrasion test as shown in FIGS. 3A to 3D. Mechanical properties of the SLIPS porous composite structures of Examples 1 and 2 were improved as compared to those of the structures of Comparative Examples 1 and 2.

Evaluation Example 2: Acid Resistance Test

After dropping 1 drop (about 10 microliters (μL) to 20 μL) of 2 M HCl on the SLIPS porous composite structures of Examples 1 and 2 and the structures of Comparative Examples 1 and 2, the surface condition change of each of the structures was evaluated, and the time for the surface condition to change was measured. The results are shown in FIGS. 12 to 15.

Figure 14:
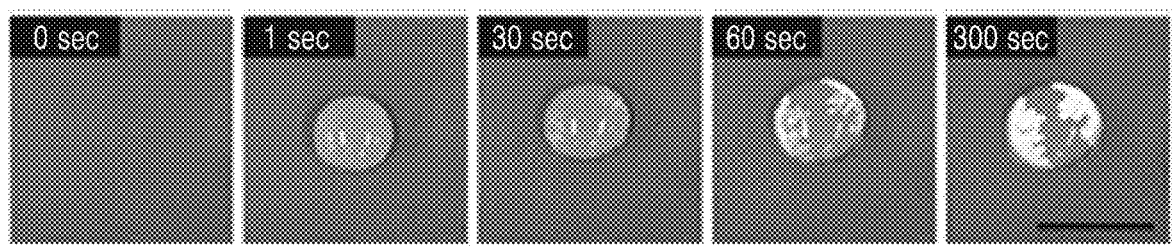
FIG. 14 shows the result of an acid resistance test performed on the structure prepared in Comparative Example 1.
Figure 15:
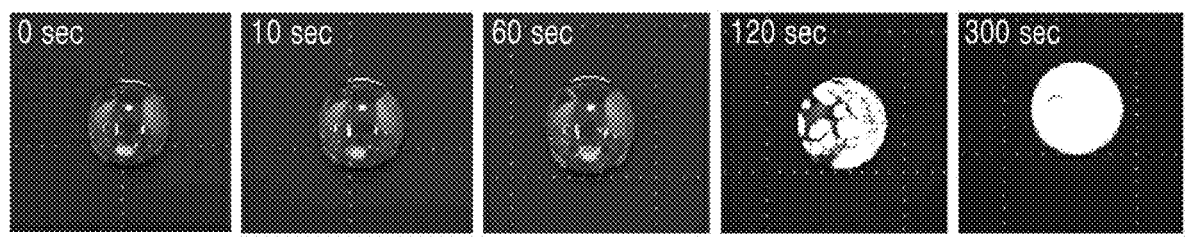
FIG. 15 shows the results of an acid resistance test performed on the structure prepared in Comparative Example 2.

A surface of the structure of Comparative Example 1 was reduced to the original Cu surface within 1 minute as shown in FIG. 14, and this reduction phenomenon was observed more after 5 minutes. Also, it was observed that a surface of the structure of Comparative Example 2 was reduced after 2 minutes. As described above, surface reduction of the structures of Comparative Examples 1 and 2 was started within 2 minutes.

Figure 12:
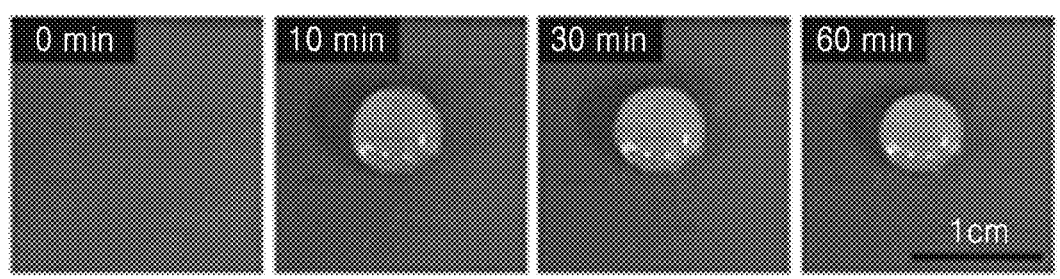
FIG. 12 shows the result of an acid resistance test performed on the slippery liquid infused porous surface (SLIPS) porous composite structure prepared in Example 1.
Figure 13:
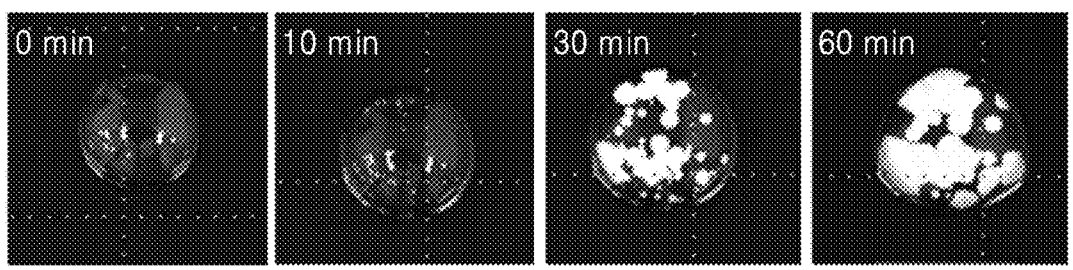
FIG. 13 shows the result of an acid resistance test performed on the SLIPS porous composite structure prepared in Example 2.

In contrast, the surface condition of the SLIPS porous composite structure of Example 1 was maintained the same even after 1 hour as shown in FIG. 12. Also, the surface of the SLIPS porous composite structure of Example 2 started to have surface reduction from 20 minutes as shown in FIG. 13.

From these results, it was confirmed that reduction of the SLIPLS porous composite structures of Examples 1 and 2 with respect to an acid solution are effectively suppressed as compared to that of the structures of Comparative Examples 1 and 2, and thus the durability of the SLIPLS porous composite structures of Examples 1 and 2 may significantly improve.

Evaluation Example 3: Scanning Electron Microscope (SEM)

(1) Example 1

Scanning electron microscope (SEM) analysis was performed on the Cu(OH)$_2$ nanorods prepared in Example 1 and the porous composite structure of Example 1. S-4700 available from Hitachi was used in the SEM analysis. The results of the SEM analysis performed on the Cu(OH)$_2$ nanorods prepared in Example 1 and the porous composite structure of Example 1 are shown in FIGS. 6 and 7.

Figure 6:
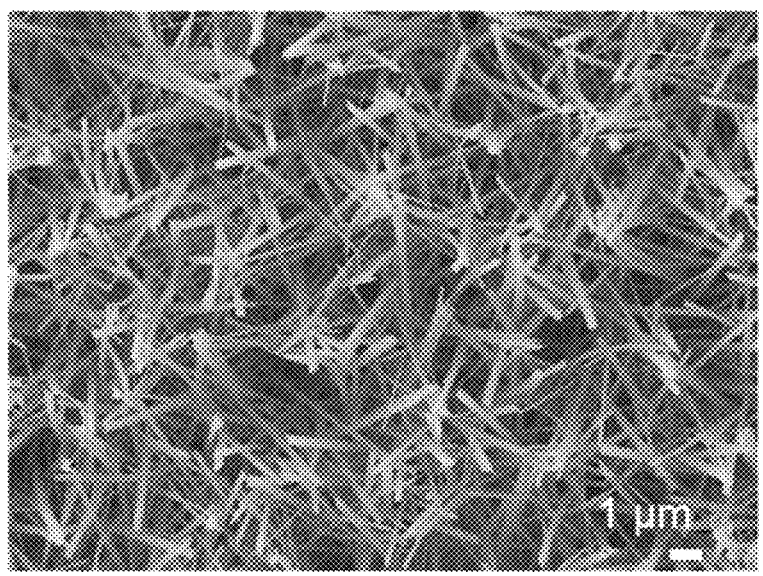
FIG. 6 is a scanning electron microscope (SEM) image of $Cu(OH)_2$ nanorods prepared according to Example 1.
Figure 7:
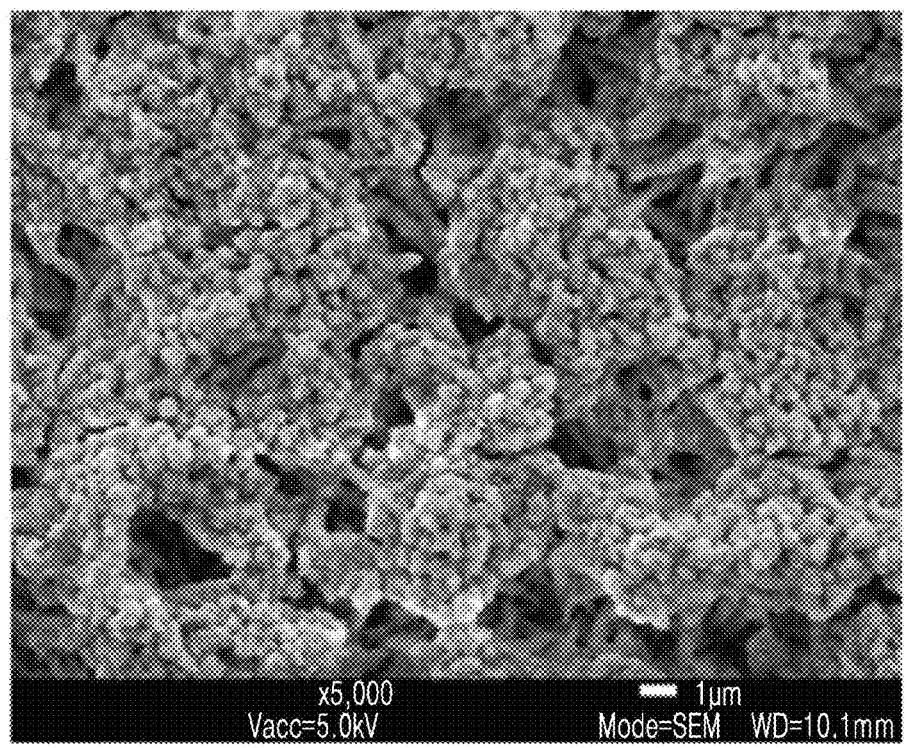
FIG. 7 is an SEM image of the porous composite structure prepared according to Example 1.

Referring to FIG. 6, shapes of the Cu(OH)$_2$ nanorods prepared in Example 1 were confirmed. Also, it was confirmed that the porous composite structure has a structure in which a silica layer is formed as shown in FIG. 7.

(2) Example 2

SEM analysis was performed on the CuO nanoblades prepared in Example 2 and the porous composite structure of Example 2. S-4700 available from Hitachi was used in the SEM analysis. The results of the SEM analysis performed on the CuO nanoblades prepared in Example 2 and the porous composite structure of Example 2 are shown in FIGS. 8 and 9.

Figure 8:
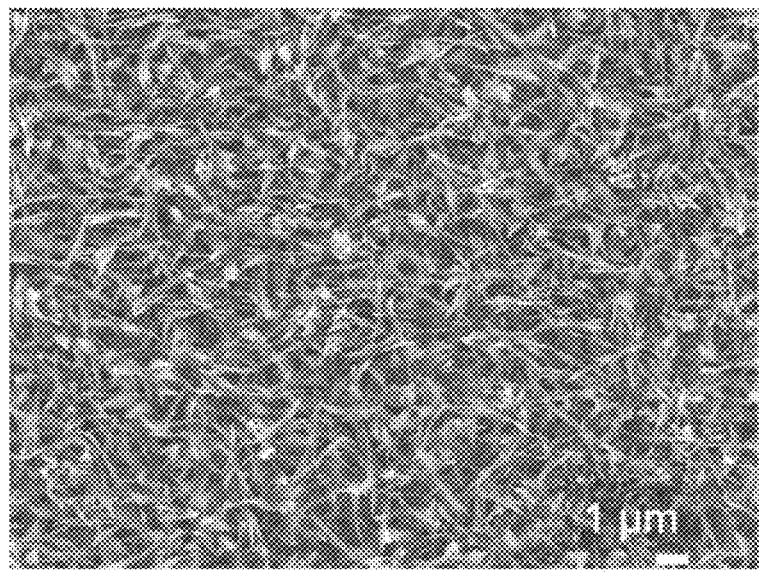
FIG. 8 is an SEM image of CuO nanoblades prepared according to Example 2.
Figure 9:
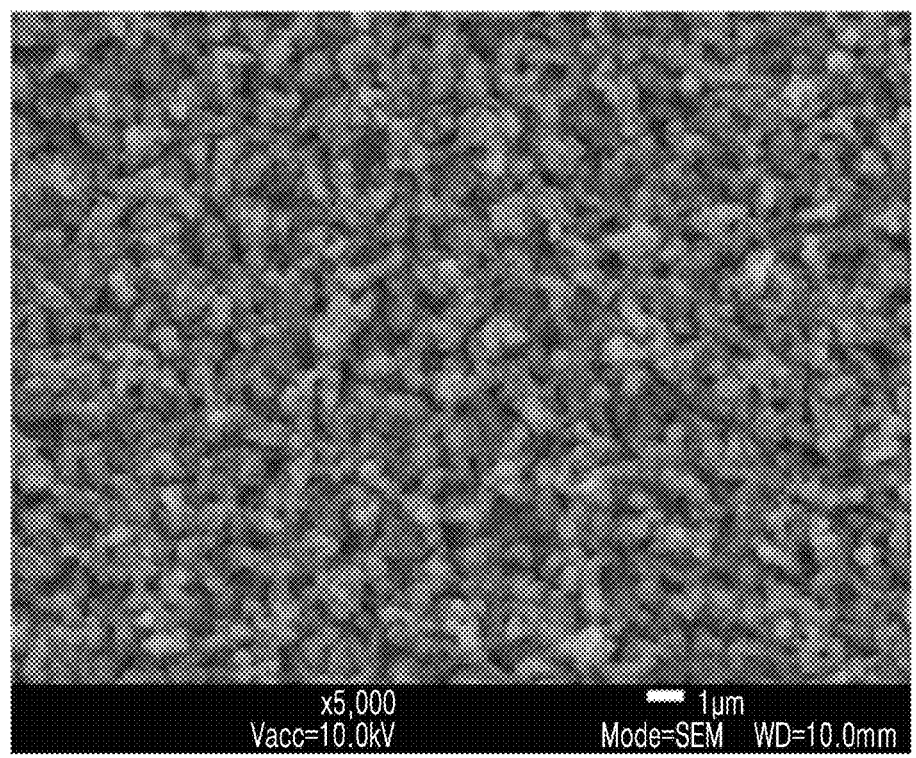
FIG. 9 is an SEM image of the porous composite structure prepared according to Example 2.

Referring to FIG. 8, shapes of the CuO nanoblades prepared in Example 2 were confirmed. Also, referring to FIG. 9, it was confirmed that the porous composite structure has a structure in which a silica layer is formed.

Evaluation Example 4: Slippery Liquid Performance Analysis

A sliding angle of the SLIPS porous composite structure of Example 1 to water, glycerol, and diiodomethane was each measured to analyze the lubricating performance of the SLIPS porous composite structure of Example 1.

Wettability of the SLIPS porous composite structure of Example 1 to liquids having various surface tension such as water, glycerol, and diiodomethane was measured using a sliding angle measurement stage. A droplet of 10 μL was dropped in 10 different locations of the SLIPS porous composite structure of Example 1. The sliding angle was measured by dropping the droplet of 10 μL on a tilt stage using a high-speed camera.

As the result of the evaluation measuring the sliding angle of the SLIPS porous composite structure of Example 1 to water, glycerol, and diiodomethane, it was confirmed that the sliding angle maintained at a low value of about 10° or less. From this, it was confirmed that the SLIPS porous composite structure of Example 1 had hydrophobicity.

Evaluation Example 5: Contact Angle

Contact angles of the SLIPS porous composite structures of Example 1 and Example 2 to water were measured using a contact angle meter.

As the result of the contact angle evaluation of the SLIPS porous composite structure of Example 1, the contact angle was 170° or greater. Also, as the result of the contact angle evaluation of the SLIPS porous composite structure of Example 2, the contact angle characteristics of the SLIPS porous composite structure of Example 2 were similar to those of the SLIPS porous composite structure of Example 1.

As described above, according to an embodiment, a porous composite structure may have improved mechanical properties and durability. When the porous composite structure is used, micro-dusts and contaminant materials in the air are easily captured by liquid in moisture/oily environments and discharged to the outside, which may improve the contaminant material removing performance of the structure. Also, the liquid in which micro-dusts and contaminant materials are captured is easily discharged from a reactor, and the burden of periodic maintenance or replacement of the reactor may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A porous composite structure, comprising:
a substrate comprising a plurality of nanostructures;
a particle layer disposed on a surface of the substrate;
a liquid; and
an interlayer, wherein the interlayer is disposed on the surface of the substrate, and the particle layer is disposed on a surface of the interlayer,
wherein the interlayer comprises a hydrolyzed, dehydrated and condensed product of a compound represented by Formula 1:

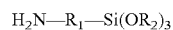 Formula 1 wherein, in Formula 1,
R$_1$ is a C1-C20 alkylene group or a C6-C20 arylene group, and
R$_2$ is hydrogen, a C1-C20 alkyl group, a C6-C20 aryl group, or Cl.

2. The porous composite structure of claim 1, wherein the substrate and the particle layer form a re-entrant structure.

3. The porous composite structure of claim 1, wherein the substrate is in a form of a porous surface; and the liquid is infused in the porous surface.

4. The porous composite structure of claim 1, further comprising a material having an affinity for the liquid.

5. The porous composite structure of claim 4, wherein the material having an affinity for the liquid is chemically bonded to the particle layer.

6. The porous composite structure of claim 4, wherein the material having an affinity for the liquid is a fluorinated silane.

7. The porous composite structure of claim 6, wherein the fluorinated silane comprises trichloro(1H,1H,2H,2H-perfluorooctyl) silane, 1H,1H,2H,2H-perfluorodecyltriethoxysilane, or a combination thereof.

8. The porous composite structure of claim 1, wherein:
the plurality of nanostructures comprises nanorods, nanoribbons, nanotubes, nanoblades, nanoplates, or a combination thereof; or
the substrate comprises a template comprising a plurality of nanoscale sized pores.

9. The porous composite structure of claim 1, wherein the substrate further comprises a base layer, and
the nanostructures comprise pillars protruding from the base layer,
wherein the base layer and the pillars are formed of a same material, and
the pillars comprise nanorods, nanoribbons, nanotubes, nanoblades, nanoplates, or a combination thereof.

10. The porous composite structure of claim 1, wherein the particle layer comprises inorganic particles, organic particles, or a combination thereof.

11. The porous composite structure of claim 1, wherein the particle layer is an inorganic particle layer comprising $SiO_2$, $Al_2O_3$, $TiO_2$, $ZnO_2$, $WO_3$, $SnO_2$, $ZrO$, indium tin oxide, $CaCO_3$, or a combination thereof.

12. The porous composite structure of claim 1, wherein the interlayer and the particle layer are bound by electrostatic attraction.

13. The porous composite structure of claim 1, wherein the particle layer comprises a positively charged silica layer and a negatively charged silica layer.

14. The porous composite structure of claim 1, wherein the substrate comprises a metal, a metal oxide, a metal hydroxide, a polymer, a glass, a ceramic, or a combination thereof.

15. The porous composite structure of claim 1, wherein a contact angle of the porous composite structure with respect to water and an organic solvent is about 170° or greater, and a sliding angle thereof is about 10° or less.

16. The porous composite structure of claim 1, wherein the compound represented by Formula 1 is (3-aminopropyl) trimethoxysilane, (3-aminopropyl)triethoxysilane, (2-aminoundecyl)trimethoxysilane, aminophenyltrimethoxysilane, bis(trimethoxysilylpropyl)amine, N-(2-aminoethyl)-3-aminopropyltrimethoxysilane, or a combination thereof.

17. A method of preparing a porous composite structure, the method comprising:
forming a particle layer on a substrate to prepare a first structure;
providing a liquid on the first structure to prepare the porous composite structure; and
forming an interlayer on the substrate before the forming of the particle layer on the substrate,
wherein the substrate comprises a plurality of nanostructures, and
wherein the forming of the interlayer comprises coating a compound represented by Formula 1 on the substrate:

$$H_2N-R_1-Si(OR_2)_3 \qquad \text{Formula 1}$$

wherein, in Formula 1,
$R_1$ is a C1-C20 alkylene group or a C6-C20 arylene group, and
$R_2$ is hydrogen, a C1-C20 alkyl group, a C6-C20 aryl group, or Cl.

18. The method of claim 17, wherein the compound represented by Formula 1 is (3-aminopropyl)triethoxysilane, (3-aminopropyl) trimethoxysilane, (2-aminoundecyl) trimethoxysilane, aminophenyltrimethoxysilane, bis(trimethoxysilylpropyl) amine, N-(2-aminoethyl)-3-aminopropyltrimethoxysilane, or a combination thereof.

19. The method of claim 17, wherein the forming of the particle layer on the interlayer to prepare the first structure comprises repeatedly contacting negatively charged inorganic particles and positively charged inorganic particles on the interlayer.

20. The method of claim 19, wherein the negatively charged inorganic particles are negatively charged colloidal silica, and the positively charged inorganic particles are positively charged colloidal silica.

21. The method of claim 17, further comprising providing a material having an affinity for the liquid on the first structure before providing the liquid on the first structure.

22. The method of claim 21, wherein the providing of the material having the affinity for the liquid comprises coating the substrate with a fluorinated silane.

23. The method of claim 22, wherein the fluorinated silane is trichloro(1H,1H,2H,2H-perfluorooctyl) silane, 1H,1H,2H,2H-perfluorodecyltriethoxysilane, or a combination thereof.

24. The method of claim 17, further comprising performing an oxygen plasma treatment.

25. The method of claim 17, further comprising
preparing the substrate by removing impurities and a native oxide layer of the substrate, and
etching to form the nanostructures.

26. An article, comprising the porous composite structure of claim 1.

27. An air purifier, comprising the porous composite structure of claim 1.

28. An air purifier of claim 27, comprising:
a duct configured to flow air comprising micro-dust therethrough;
a droplet sprayer configured to spray water inside the duct to form a gas-liquid mixture fluid and collect micro-dusts in the air;
a dust collector comprising a porous member comprising micro-channels through which the gas-liquid mixture fluid is configured to pass, the dust collector configured to collect the droplets comprising the micro-dust,
wherein the porous member comprises a porous composite structure comprising
a substrate comprising a plurality of nanostructures;
a particle layer disposed on a surface of the substrate; and
a liquid; and
a discharge plasma generating device configured to generate a discharge plasma in the dust collector, a catalyst reactor configured to remove ozone discharged from the dust collector using a catalyst, or a combination thereof.

29. The air purifier of claim 28, further comprising a discharge plasma generating device configured to generate a discharge plasma in the dust collector.

30. The air purifier of claim 28, further comprising a catalyst reactor configured to remove ozone discharged from the dust collector using a catalyst.

* * * * *